United States Patent
Hobart et al.

(10) Patent No.: US 12,446,249 B2
(45) Date of Patent: Oct. 14, 2025

(54) POLARIZATION-ENGINEERED HETEROGENEOUS SEMICONDUCTOR HETEROSTRUCTURES

(71) Applicant: The Government of the United States of America, as represented by the Secretary of the Navy, Arlington, VA (US)

(72) Inventors: Karl D. Hobart, Alexandria, VA (US); Marko J. Tadjer, Vienna, VA (US); Michael A. Mastro, Fairfax, VA (US); Mark Goorsky, Valencia, CA (US); Asif Khan, Columbia, SC (US); Samuel Graham, Jr., Lithonia, GA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 638 days.

(21) Appl. No.: 17/731,289

(22) Filed: Apr. 28, 2022

(65) Prior Publication Data
US 2023/0352571 A1 Nov. 2, 2023

(51) Int. Cl.
*H10D 30/47* (2025.01)
*H10D 30/01* (2025.01)
(Continued)

(52) U.S. Cl.
CPC ....... *H10D 30/4732* (2025.01); *H10D 30/015* (2025.01); *H10D 62/824* (2025.01); *H10D 62/8503* (2025.01)

(58) Field of Classification Search
CPC ............. H01L 29/7783; H01L 29/2003; H01L 29/205; H01L 29/66462; H01L 21/187;
(Continued)

(56) References Cited

U.S. PATENT DOCUMENTS

| | | | |
|---|---|---|---|
| 2005/0067629 A1* | 3/2005 | Woodall | H10D 62/80 257/E29.189 |
| 2009/0085065 A1 | 4/2009 | Mishra | |

(Continued)

OTHER PUBLICATIONS

M. Jewel et al., "Trap characterization in ultra wide bandgap Al0.65Ga0.4N/Al0.4Ga0.6N MOSHFET's with ZrO2 gate dielectric using optical response and cathodoluminescence," Appl. Phys. Lett. 115, 213502 (2019).
(Continued)

*Primary Examiner* — Fernando L Toledo
*Assistant Examiner* — Shawn Shaw Muslim
(74) *Attorney, Agent, or Firm* — US Naval Research Laboratory; Jorie L. Stroup

(57) ABSTRACT

Semiconductor heterostructures having an engineered polarization. Semiconductor materials having specified crystallographic directions and specified polarizations are directly bonded to one another by means of atomic layer bonding without the use of any interfacial bonding materials, where spontaneous polarization of the two layers produced by joining the two materials by direct wafer bonding produces a strong 2DEG or 2DHG at the interface. Embodiments include GaN/AlN and AlN/GaN heterostructures having an N- or Ga-polar GaN layer directly bonded to an N- or Al-polar Al layer. Other embodiments can incorporate an InN epitaxial layer or an alloy incorporating an N-polar, Al-polar, or Ga-polar material having In, Al, or Ga in the crystal lattice, e.g., $(In_xAl_{1-x}N)$, $In_xGa_{1-x}N$, $Al_xGa_{1-x}N$, $In_xAl_yGa_{1-x-y}N$, where ($0<x\le1$, $0<y\le1$, $0<x+y\le1$).

23 Claims, 21 Drawing Sheets

(51) Int. Cl.
*H10D 62/824* (2025.01)
*H10D 62/85* (2025.01)

(58) Field of Classification Search
CPC .............. H01L 29/045; H01L 29/7781; H01L 29/7786
See application file for complete search history.

(56) References Cited

U.S. PATENT DOCUMENTS

| | | | |
|---|---|---|---|
| 2009/0321854 A1 | 12/2009 | Ohta | |
| 2010/0264401 A1* | 10/2010 | Adivarahan | H01L 33/12 438/47 |
| 2013/0043468 A1 | 2/2013 | Adekore | |
| 2014/0253241 A1 | 9/2014 | Lee | |
| 2014/0264379 A1* | 9/2014 | Kub | H01L 21/762 257/77 |
| 2019/0115497 A1* | 4/2019 | Zhang | H10H 20/812 |
| 2020/0221969 A1* | 7/2020 | Ram | H01L 31/08 |
| 2021/0020760 A1 | 1/2021 | Hoshi | |
| 2021/0028295 A1* | 1/2021 | Wathuthanthri | H01L 29/0615 |
| 2021/0057560 A1 | 2/2021 | Cheng | |
| 2021/0249513 A1* | 8/2021 | Chaudhuri | H01L 29/225 |
| 2021/0313760 A1* | 10/2021 | Sato | H01S 5/0203 |
| 2022/0051889 A1 | 2/2022 | Yoshiya | |
| 2023/0360911 A1* | 11/2023 | Yoshiya | H10D 30/015 |

OTHER PUBLICATIONS

S. Hayashi et al., "Chemical mechanical polishing of exfoliated III V layers," ECS Transactions 16, No. 8 (2008): 295.
S. Hayashi et al., "Chemical mechanical polishing of GaN," Journal of The Electrochemical Society 155, No. 2 (2007): H113.
K. Y. Byun et al., 2010, "Low temperature germanium to silicon direct wafer bonding using free radical exposure," Applied Physics Letters, 96(10), p. 102110.
Z. Cheng et al., 2020, "Thermal Transport across Ion Cut Monocrystalline β Ga2O3 Thin Films and Bonded 3 Ga2O3—SiC Interfaces," ACS Applied Materials & Interfaces, 12(40), pp. 44943 44951.
S. Hayashi et al., 2005, "InGaAs quantum wells on wafer bonded InP/GaAs substrates," Journal of applied physics, 98(9), p. 093526.
M. J. Jackson, 2011, "Reduction of the potential energy barrier and resistance at wafer bonded n GaAs/n GaAs interfaces by sulfur passivation," Journal of Applied Physics, 110(10), p. 104903.
P. T. Chiu et al., 2013, "Direct semiconductor bonded 5J cell for space and terrestrial applications," IEEE Journal of Photovoltaics, 4(1), pp. 493 497.
F. Dimroth et al., 2014, "Wafer bonded four-junction GaInP/GaAs// GaInAsP/GaInAs concentrator solar cells with 44.7% efficiency," Progress in Photovoltaics: Research and Applications, 22(3), pp. 277-282.
V. Dragoi et al., 2018, "Direct Wafer Bonding of GaN for Power Devices Applications," ECS Transactions, 86(5), p. 23.
A. M. Dabiran et al, "Very high channel conductivity in low defect AlN/GaN high electron mobility transistor structures," Appl. Phys. Lett. 93, 082111 (2008).
S. H. Sohel et al "X Band Power and Linearity Performance of Compositionally Graded AlGaN Channel Transistors," EEE Electron Device Letters, vol. 39, No. 12, Dec. 2018.
S. Keller et al., "Recent progress in metal organic chemical vapor deposition of 0001 N polar group III nitrides," Semicond. Sci. Technol. 29 (2014) 113001.
I. Abid et al., "High Lateral Breakdown Voltage in Thin Channel AlGaN/GaN High Electron Mobility Transistors on AiN/Sapphire Templates," Micromachines 2019, 10(10), 690).
Y. R. Koh et al., "Bulk like Intrinsic Phonon Thermal Conductivity of Micrometer Thick AlN Films," CS Appl. Mater. Interfaces 2020, 12, 29443-29450).
O. Ambacher et al., "Two dimensional electron gases induced by spontaneous and piezoelectric polarization charges In undoped and doped AlGaN/GaN heterostructures," J. Appl. Phys., vol. 87, No. 1, pp. 334-344(2000).
D. Alam et al, "Excimer laser liftoff of AlGaN/GaN HEMTs on thick AlN heat spreaders," Appl. Phys. Lett. 119 (13):132106 (2021).
G. Singh Bhalla, et al., "Built in and induced polarization across LaAlO3/SrTiO3 heterojunctions," Nature Phys. 7, 80-86 (2011).
M. Noor-A-Alam, et al., Ferroelectricity and Large Piezoelectric Response of AlN/ScN Superlattice, ACS Applied Materials & Interfaces 2019 11 (22), 20482-20490.
F. Bernardini et al, "Spontaneous polarization and piezoelectric constants of III V nitrides," Phys. Rev. B 56, R10024(R).
W. Troy et al, "Spontaneous Polarization Calculations in Wurtzite II Oxides, III Nitrides, and SiC Polytypes through Net Dipole Moments and the Effects of Nanoscale Layering," Nanomaterials 11, No. 8: 1956 (2021).
S.B. Cho et al, "Epitaxial engineering of polar & Ga2O3 for tunable two dimensional electron gas at the heterointerface," Appl. Phys. Lett. 112, 162101 (2018).
P. Ranga et al, "Highly tunable, polarization engineered two dimensional electron gas in & AlGaO3/& Ga2O3 heterostructures," Applied Physics Express 13, 061009 (2020).
W. Li et al, "Two dimensional carrier gas at complex oxide interfaces: Control of functionality," Journal of Applied Physics 130, 024103 (2021).
J.A. del Alamo et al, "GaN HEMT reliability," Microelectronics Reliability 49, 1200 (2009).
Y. Hayashi et al, "Polarity inversion of aluminum nitride by direct wafer bonding," Appl. Phys. Expr. 11, 031003 (2018).
A. Savage, "Pyroelectricity and Spontaneous Polarization in LiNbO3," Journal of Applied Physics vol. 37, No. 8, pp. 3071-3072 (1966).
X. Luo et al., "Scaling and high frequency performance of AlN/GaN HEMTs," 2011 IEEE International Symposium on Radio Frequency Integration Technology, 2011, pp. 209 212.
USPTO Office Action, U.S. Patent & Trademark Office, U.S. Appl. No. 17/731,297, filed Sep. 3, 2024.

* cited by examiner

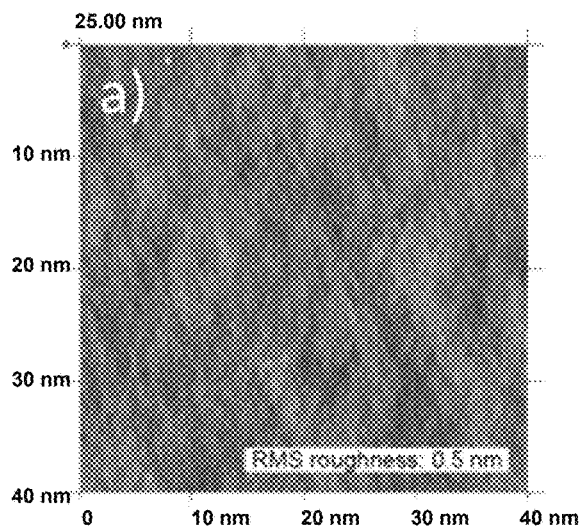
*FIG. 3A*
*(Prior Art)*
*FIG. 3B*
*(Prior Art)*
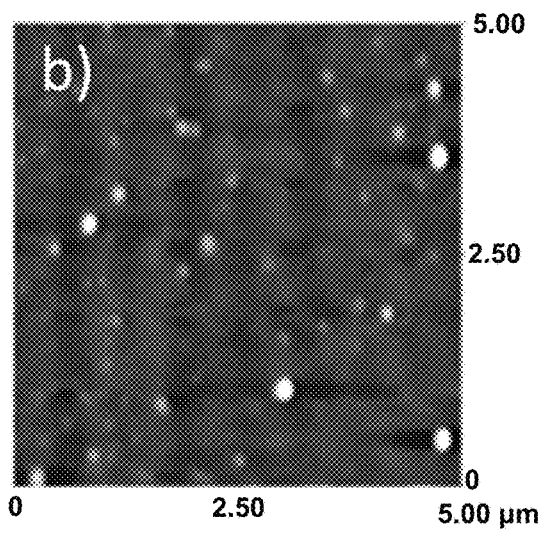
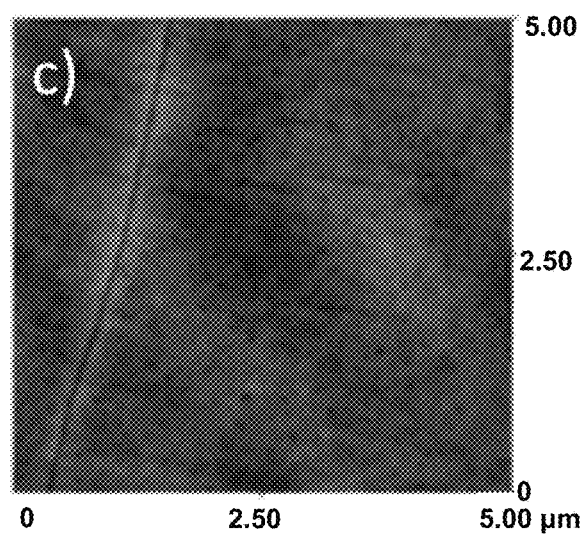
*FIG. 3C*
*(Prior Art)*

Yusuke Hayashi et al
2018 Appl. Phys. Express 11 031003

POLARIZATION-ENGINEERED HETEROGENEOUS SEMICONDUCTOR HETEROSTRUCTURES

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #210780.

TECHNICAL FIELD

The present disclosure relates to fabrication of semiconductor devices, particularly to fabrication of devices incorporating heterogeneous-semiconductor heterostructures having engineered polarity such that the devices can exhibit high breakdown voltage, high carrier density, and high carrier mobility/velocity while overcoming the thermal limitations of existing devices.

BACKGROUND

Today, every nitride-based high electron mobility transistor (HEMT) device currently in use consists of a thin, strained heteroepitaxial barrier that is expected to generate sufficient spontaneous and piezoelectric polarization to support the formation of a two-dimensional electron gas (2DEG) or two-dimensional hole gas (2DHG) channel having high carrier density and high carrier mobility in such devices, with such devices having high breakdown voltage and high reliability while simultaneously being constrained by high piezoelectric stress, high electric field, and high temperature near the surface caused by the presence of the barrier layer.

Growth of low defect density ($<5\times10^8$ cm$^{-2}$), high quality, crack-free thick AlN layers (3-16 µm) on sapphire substrates has recently been reported. See M. Jewel et al, "Trap characterization in ultra-wide bandgap Al0.65Ga0.4N/Al0.4Ga0.6N MOSHFET's with ZrO2 gate dielectric using optical response and cathodoluminescence," *Appl. Phys. Lett.* 115, 213502 (2019). The crystalline quality of these AlN layers is shown by the images in FIGS. 1A and 1B, where the plan view TEM image near the surface of AlN on sapphire shows a low ($1\times10^8$ cm$^{-2}$) dislocation density in the AlN layer and the high-resolution scanning transmission electron microscopy (HRSTEM) image of the AlN layer in FIG. 1B shows that the AlN exhibits crystallinity near the surface with the N-polar at the top and the Al face at the bottom of the AlN layer. The crystalline quality of AlN grown on sapphire is further illustrated by the results of X-ray diffraction (XRD) scans performed on the AlN films shown in FIG. 1C, which show a sharp AlN (0004) peak that is fully relaxed from the sapphire substrate.

The measured bulk thermal conductivity of these layers (>300 W/m-K) was better than bulk AlN substrates due to extremely low carbon and oxygen impurities. See Y. R. Koh et al, "Bulk-like Intrinsic Phonon Thermal Conductivity of Micrometer-Thick AlN Films," *CS Appl. Mater. Interfaces* 2020, 12, 29443-29450. High-quality, low-defect GaN layers having thicknesses of 3-8 µm have also been grown on sapphire substrates for use as buffer layers for GaN/AlGaN HEMTs.

Researchers at the University of South Carolina have also investigated the effect of laser liftoff (LLO) and transfer of HEMT structures from one substrate to another, where an Al$_{0.26}$Ga$_{0.74}$N—GaN HEMT was grown on a sapphire substrate and was removed from the sapphire via laser liftoff. The lifted-off N-face of the N-polar AlN surface was cleaned using a wet-dry etch process and the HEMT was then bonded to a copper heat sink in a manner similar to that illustrated by the block schematic in FIG. 2A. See D. Alam et al, "Excimer laser liftoff of AlGaN/GaN HEMTs on thick AlN heat spreaders," *Appl. Phys. Lett.* 119(13):132106 (2021).

The direct-current output characteristics (drain current density as a function of gate and drain voltage) of the HEMT before (FIG. 2B) and after (FIG. 2C) liftoff and transfer was investigated, and the results are shown by the plots in FIGS. 2B-2E. The measurements shown in FIGS. 2B and 2C show that current density decreased but remained comparable after laser liftoff separated the HEMT device from the substrate. It is believed that further optimization of the LLO process can mitigate this reduction. Micro-Raman spectra and X-ray (0002) spectra of the HEMT before and after liftoff are shown in FIGS. 2D and 2E, respectively. As shown in FIG. 2D, the $E_2$(high) phonon linewidth of the GaN channel layer, which is a measure of the crystalline quality, remained the same (~7 cm$^{-1}$) before and after LLO, while the X-ray spectra in FIG. 2E illustrates that both AlN and GaN $E_2$(high) phonons show ~3 cm$^{-1}$ red-shift after LLO, indicating strain relief in both the AlN buffer and the GaN channel layers. This small strain relief is supported by HRXRD which also shows the crystallinity of the structure is maintained.

In all cases, the performance of the HEMT after laser liftoff is comparable to its performance before it was removed from the original substrate, demonstrating that laser liftoff processes do not significantly affect the two-dimensional electron gas (2DEG) that is produced in HEMT structures and will not degrade the layers, either before or after bonding.

Wafer bonding of semiconductor layers has been used to produce heterostructures where epitaxial growth may not be feasible.

A key requirement for wafer bonding is that the surfaces of the layers to be bonded must be smooth, preferably having less than 0.5 nm root-mean-square (RMS) roughness.

Chemical-mechanical polishing (CMP) of III-V materials after LLO is an important step after LLO to achieve such a smooth surface.

Researchers as the University of California at Los Angeles (UCLA) and the University of South Carolina have investigated such CMP of materials after LLO, including both Ga-polar and N-polar GaN. See S. Hayashi et al, "Chemical mechanical polishing of GaN," *Journal of The Electrochemical Society* 155, No. 2 (2007): H113; and S. Hayashi et al, "Chemical mechanical polishing of exfoliated III-V layers," *ECS Transactions* 16, No. 8 (2008): 295. The results of such CMP of AlN and GaN layers are illustrated by the AFM micrographs in FIGS. 3A-3C. As shown in FIG. 3A, the roughness of the N-face of an N-polar GaN layer was decreased to a RMS of 0.5 nm or less with controlled removal rates (down to a few nm/min) during CMP. Similar results were achieved for AlN, where a rough lifted-off N-face of N-polar AlN (FIG. 3) was polished to obtain a smooth face having an RMS roughness of less than 1 nm (FIG. 3C).

Additional work has been done regarding bonding zincblende III-V semiconductors as well as hybrid IIInitride-silicon structures and other material combinations (Si—Ge or β-Ga$_2$O$_3$ on SiC). See K. Y. Byun et al, 2010, "Low temperature germanium to silicon direct wafer bonding using free radical exposure," *Applied Physics Letters*, 96(10), p. 102110; and Z. Cheng et al, 2020, "Thermal Transport across Ion-Cut Monocrystalline β-Ga$_2$O$_3$ Thin Films and Bonded β-Ga2O3-SiC Interfaces," *ACS Applied Materials & Interfaces*, 12(40), pp. 44943-44951.

Previous bonding work by the present inventors has involved bonding (and exfoliating and chemical mechanical polishing) InP to alternative substrates using SiN interfacial bonding layers or using a plasma-formed oxide to bond Si to Ge. See S. Hayashi et al, 2005, "InGaAs quantum wells on wafer-bonded InP/GaAs substrates," *Journal of Applied Physics*, 98(9), p. 093526; see also Byun et al, supra. Such approaches mimicked silicon-on-insulator structures and the heterogeneous InP/GaAs heterostructure was used for subsequent InAlAs/InGaAs quantum well epitaxial growth with results similar to growth on a standard InP substrate.

FIGS. 4A-4C are cross-sectional TEM (XTEM) images illustrating aspects of this previous bonding work in accordance with the prior art. FIG. 4A shows an MOVPE InGaAs/InAlAs quantum well structure formed by bonding a 3-inch InP wafer and a 3-inch GaAs wafer using a SiN bonding layer. FIG. 4B shows a transmission image of the bonded wafer pair shown in FIG. 4A.

In some cases, functional p-n junctions have been obtained using very thin dielectric layers for bonding. FIG. 4C shows a structure wherein Si is bonded to Ge using a thin (~2-3 nm) intermediate dielectric layer (shown as the bright layer in the FIGURE). However, the presence of the SiN interlayers (or any other dielectric layer) limits the interaction between the semiconducting layers on either side, possibly preventing the device from being fully functional.

Because of this, it has been theorized that the best results for heterogeneous heterostructures with vertical transport were obtained using structures that employ direct wafer bonding without the presence of a dielectric interlayer. Previous efforts to obtain transport across a bonded interface demonstrated atomic bonding without the presence of any interfacial layers. In those cases, an (NH$_4$)$_2$S surface treatment involving the application of pressures on the order of kPa and annealing temperatures of 400° C. or up to 600° C. led to a chemisorbed S layer that dramatically reduced the interface state density across III-V heterostructures, including GaAs/GaAs, InP/InP and InP/GaAs. See M. J. Jackson, 2011, "Reduction of the potential energy barrier and resistance at wafer-bonded N—GaAs/N—GaAs interfaces by sulfur passivation," *Journal of Applied Physics*, 110(10), p. 104903.

The images in FIGS. 5A and 5B show GaAs bonded to GaAs and InP, respectively, in accordance with the prior art. These bonded structures were examined, and it was found that misorientation played a significant role in the degradation of the I-V response across an n-n junction. However, it was also found that crystallographically aligned S-treated surfaces that were subsequently bonded showed excellent I-V characteristics, as shown by the plot in FIG. 5C. It should be noted that world-record high efficiency solar cells at one sun and under concentration were achieved following this basic approach. See P. T. Chiu et al, 2013, "Direct semiconductor bonded 5J cell for space and terrestrial applications," *IEEE Journal of Photovoltaics*, 4(1), pp. 493-497; see also F. Dimroth et al, 2014, "Wafer bonded four-junction GaInP/GaAs//GaInAsP/GaInAs concentrator solar cells with 44.7% efficiency," *Progress in Photovoltaics: Research and Applications*, 22(3), pp. 277-282.

Additional research has also been conducted regarding in-situ surface layers for which bonding can occur at room temperature but in which crystalline damage at the original surfaces due to the in-situ surface modification—and hence the bonded interface—are reconstructed after bonding through annealing. GaN/Si bonded interfaces such as that shown in FIG. 6A have been formed using this approach without the presence of an interlayer after annealing at 700° C.; this points to the expected ability to bond both GaN and AlN at similarly low temperatures. See V. Dragoi et al, "Direct Wafer Bonding of GaN for Power Devices Applications," *ECS Transactions*, 86(5), p. 23 (2018).

The GaN and Si in the structure shown in FIG. 6A are both strain-free at room temperature. These results confirm that the bonded structures can withstand thermal expansion strains induced by high-temperature annealing. Other studies of GaN—GaN and AlN—AlN bonding also support the promise of the proposed approach. The previous studies achieved bonding at higher temperatures (1700° C.) but did demonstrate the formation of a polarity inversion in an AlN—AlN bonded structure, as illustrated by the transmission electron micrographs shown in FIG. 6B. See Y. Hayashi et al, "Polarity inversion of aluminum nitride by direct wafer bonding," *Appl. Phys. Expr.* 11, 031003 (2018).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method for forming a nitride-based heterostructure by means of atomic layer bonding without the use of any interfacial layers and provides GaN- and/or AlN-based heterostructures that leverage the strong spontaneous polarization P$_{SP}$ formed by joining strain-relaxed GaN and AlN epitaxial films or bulk substrates by direct wafer bonding along specific crystallographic directions. In some exemplary embodiments, a GaN or an AlN crystal is constructed from a GaN or an AlN epitaxial layer, while in other embodiments, the crystal may include an InN epitaxial layer or an alloy incorporating In, Al, or Ga in the crystal lattice, e.g., (In$_x$Al$_{1-x}$N), In$_x$Ga$_{1-x}$N, Al$_x$Ga$_{1-x}$N, In$_x$Al$_y$Ga$_{1-x-y}$N, where (0<x≤1, 0<y≤1, 0<x+y≤1). Incorporation of Al causes the energy gap of the alloys to increase; incorporation of In causes the energy gap of the alloys to decrease.

The present invention uses direct wafer bonding to join the two epitaxial semiconductor films, wherein the surfaces of the two films are smooth, flat, and free of contaminants and particles, with a root mean square (RMS) roughness of less than 0.5 nm. Typically, the wafer surfaces must be activated such that the materials in the films are attracted to each other, e.g., by chemical treatments that leave active species of e.g., OH$^-$ or H$^+$ bound to the surface, such that joining the two activated surfaces results in immediate covalent bonding at room temperature.

The present invention provides polarization-engineered semiconductor heterostructures having arbitrarily thick layers and methods for making the same. In some embodiments in accordance with the present invention, these structures may have thinner top layers in order to facilitate electrical contact to the charge carriers in the device. In accordance with the present invention, the semiconductor materials and the orientation of the bonded surfaces of the semiconductor materials relative to their respective polarity can be selected to produce a predetermined 2DEG or 2DHG at the interface between the bonded first and second semiconductor material layers.

In a first exemplary embodiment in accordance with the present invention, the N-face of a [0001] Ga-polar GaN layer is directly bonded to the N-face of [000-1] N-polar AlN. The spontaneous polarization $P_{SP}$ produced by this bonding of the N-face of strain-relaxed [0001] Ga-polar GaN to the N-face of strain-relaxed [000-1] N-polar AlN results in the formation of a two-dimensional electron gas (2DEG) having an electron concentration as high as $10^{20}$ $cm^{-3}$ at the AlN/GaN interface.

In a second exemplary embodiment in accordance with the present invention, the Ga-face of a [000-1] N-polar GaN layer is directly bonded to the N-face of [000-1] N-polar AlN. As in the first embodiment, in this second embodiment, the spontaneous polarization $P_{SP}$ produced by this bonding of the Ga-face of strain-relaxed [000-1] N-polar GaN to the N-face of strain-relaxed [000-1] N-polar AlN results in the formation of a two-dimensional electron gas (2DEG) having an electron concentration as high as $10^{20}$ $cm^{-3}$ at the AlN/GaN interface.

In a third exemplary embodiment, the N-face of a [0001] Ga-polar GaN layer is bonded to the Al-face of [0001] Al-polar AlN. In this case, the spontaneous polarization $P_{SP}$ produced by this bonding of the N-face of strain-relaxed [0001] Ga-polar GaN to the Al-face of strain-relaxed [0001] Al-polar AlN results in the formation of a two-dimensional hole gas (2DHG) having a hole concentration as high as $10^{20}$ $cm^{-3}$ at the AlN/GaN interface.

In a fourth exemplary embodiment, the Ga-face of an [000-1] N-polar GaN layer is bonded to the Al-face of [0001] Al-polar AlN. In this case, the spontaneous polarization $P_{SP}$ produced by this bonding of the Ga-face of strain-relaxed [000-1] N-polar GaN to the Al-face of strain-relaxed [0001] Al-polar AlN results in the formation of a two-dimensional hole gas (2DHG) having a hole concentration as high as $10^{20}$ $cm^{-3}$ at the AlN/GaN interface.

The present invention also provides AlN/GaN HEMTs corresponding to the GaN/AlN HEMTs, wherein the AlN/GaN HEMTs have a thin top AlN layer which enables improved electrical contact to the charge carriers in the AlN/GaN device.

The spontaneous polarization which generates a high 2DEG or 2DHG charge should lead to more reliable HEMTs suitable for next-generation very high-power devices.

BRIEF DESCRIPTION OF THE DRAWINGS

FIGS. 3A-3C illustrate aspects of chemical-mechanical polishing of GaN and AlN films on the RMS roughness of the film surface.

DETAILED DESCRIPTION

Figure 1A:
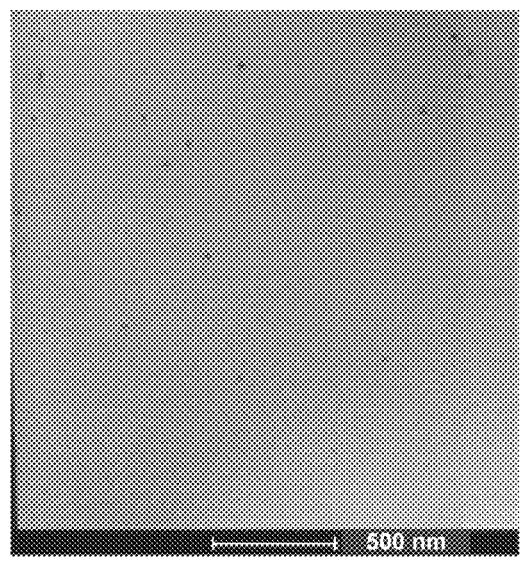
FIGS. 1A-1C illustrate aspects of the crystalline quality of AlN films formed on sapphire substrates.
Figure 1B:
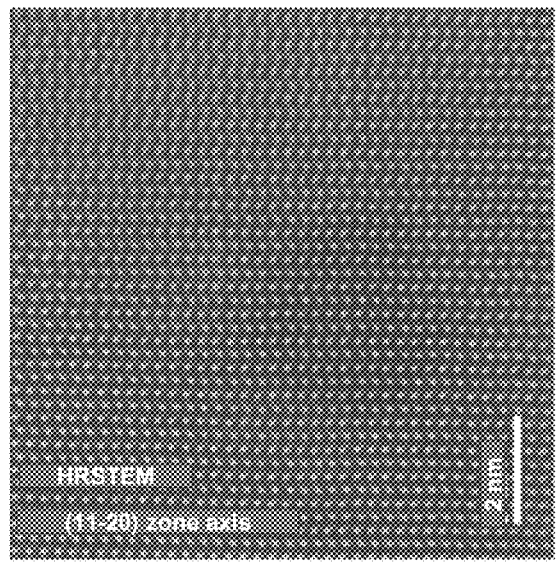
Figure 1C:
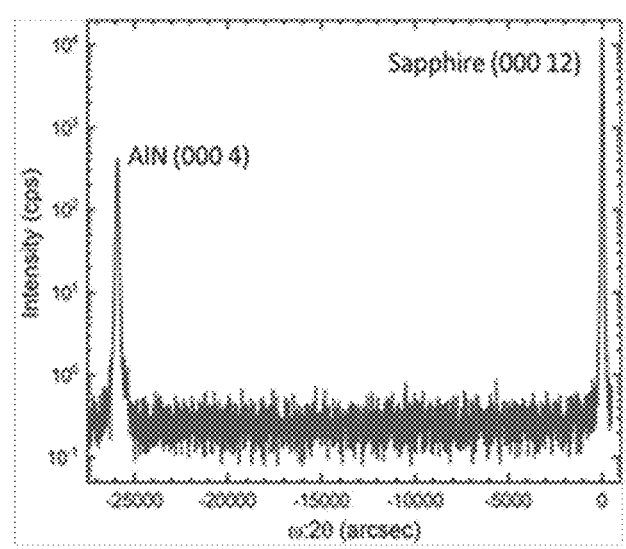
Figure 2A:
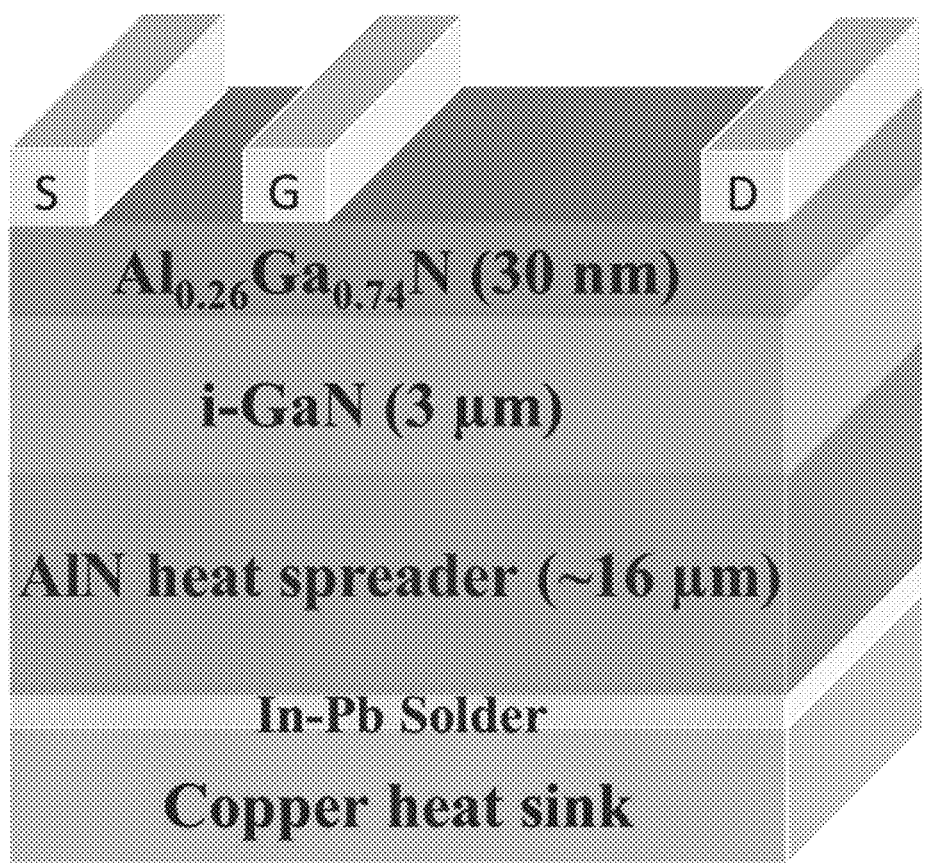
FIGS. 2A-2E illustrate aspects of the effect of laser lift-off and transfer of nitride-based heterostructures from one substrate to another.
Figure 2B:
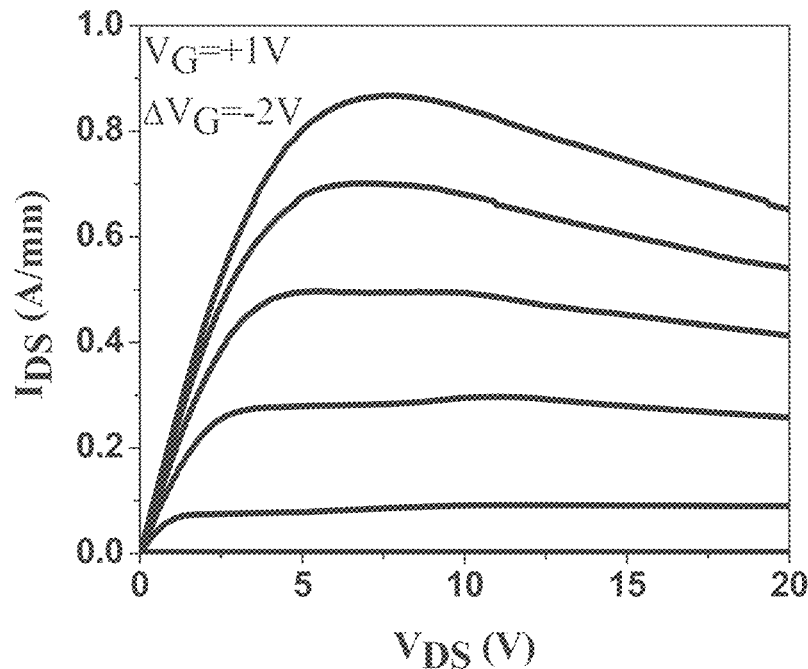
Figure 2C:
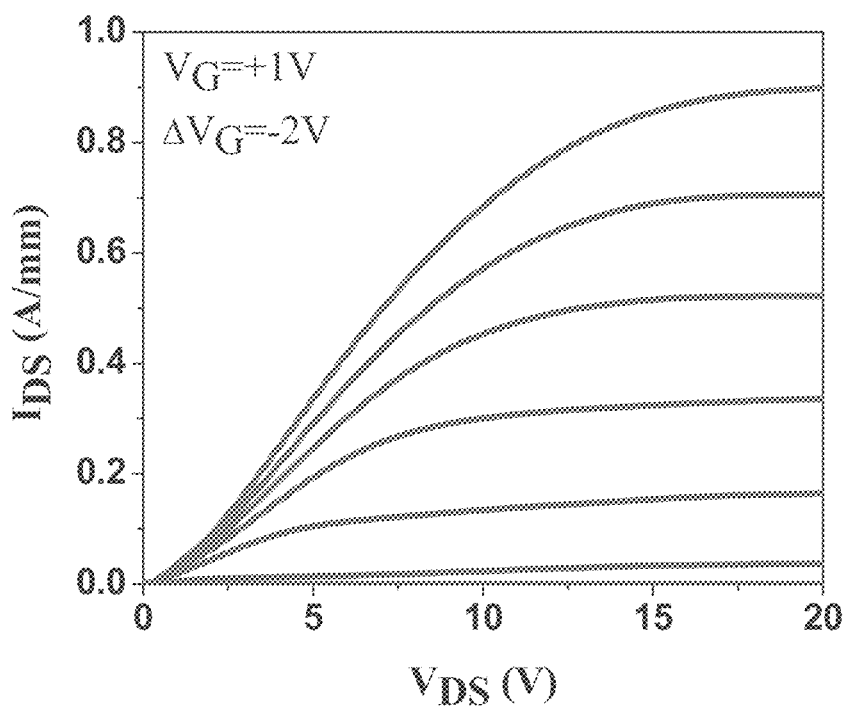
Figure 2D:
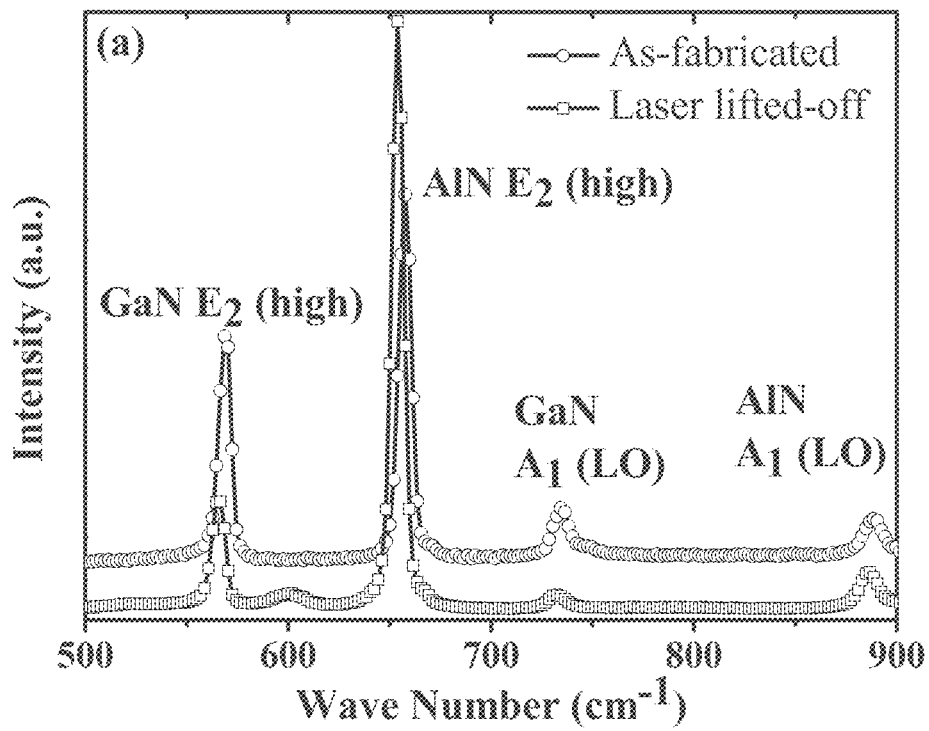
Figure 2E:
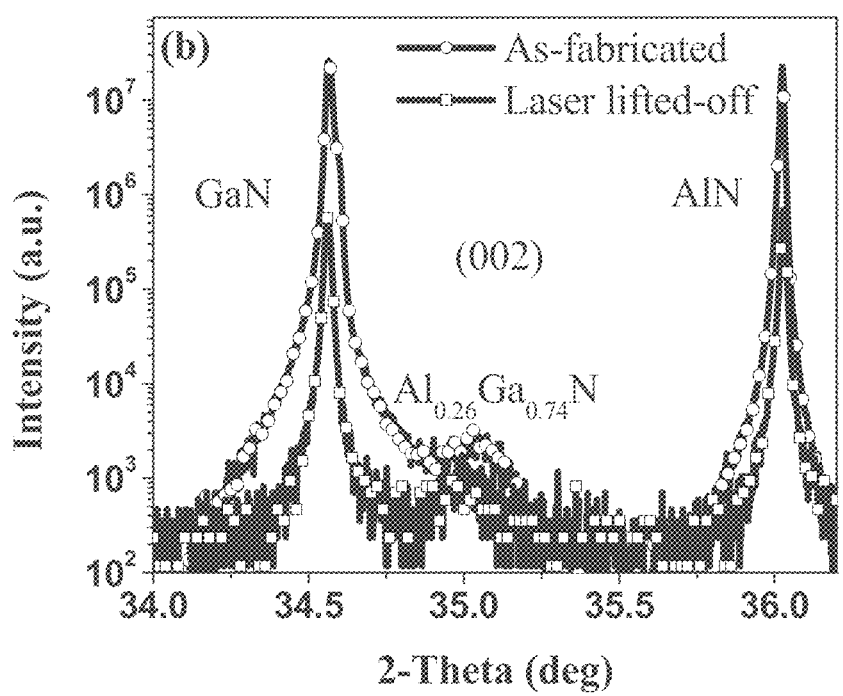
Figure 4A:
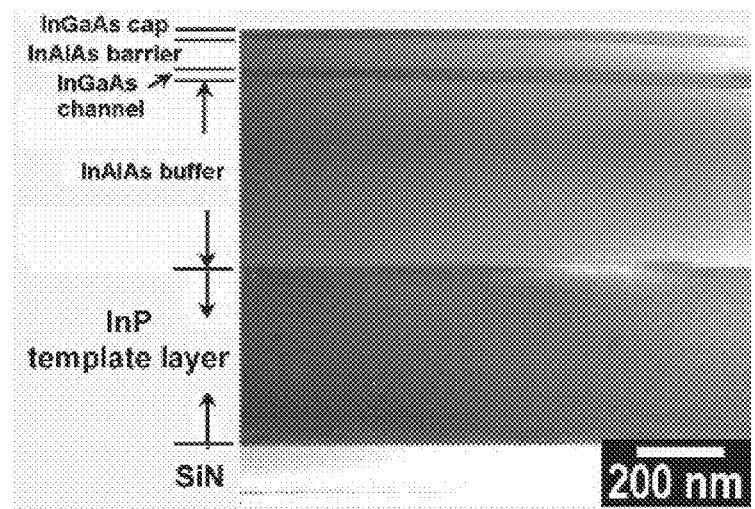
FIGS. 4A-4C illustrate aspects of the effects of bonding on nitride-based heterostructures.
Figure 4B:
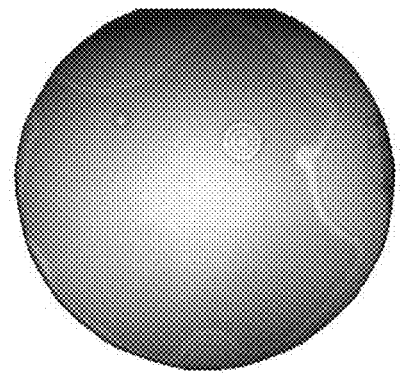
Figure 4C:
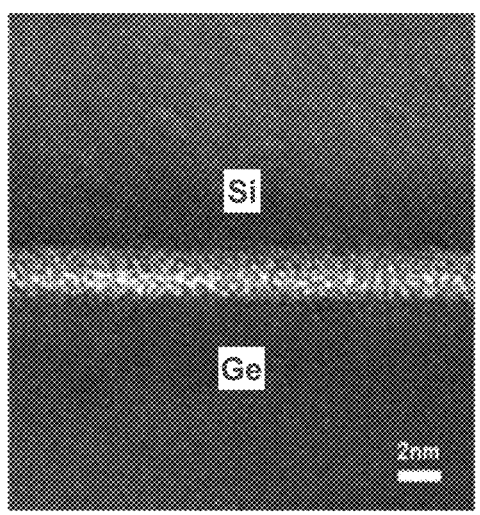
Figure 5A:
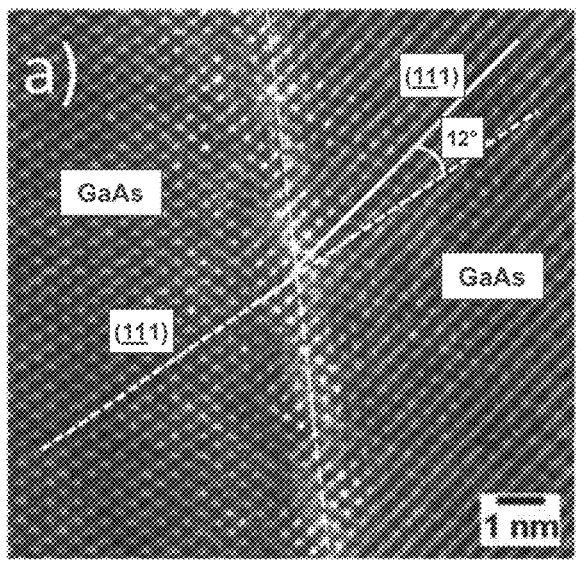
FIGS. 5A-5C illustrate aspects of the effect of bonding of GaAs to GaAs and bonding of GaAs to InP.
Figure 5B:
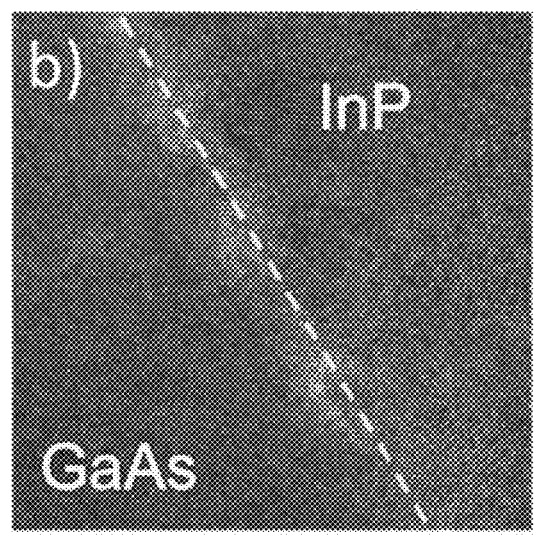
Figure 5C:
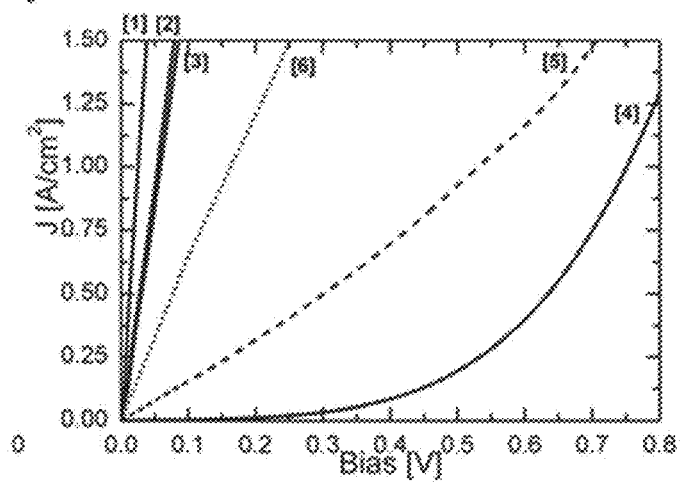
Figure 6A:
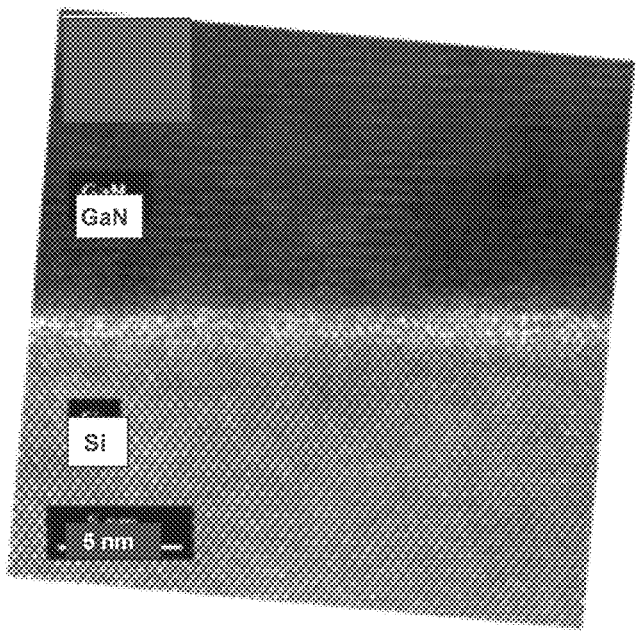
FIGS. 6A-6B further illustrate aspects of bonded nitride-based heterostructures.
Figure 6B:
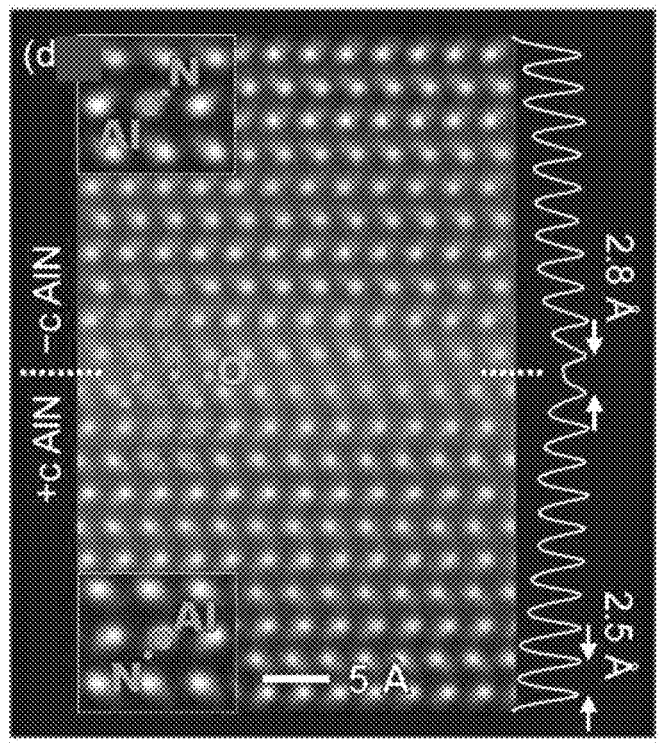

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

For example, although the present disclosure and FIGURES are presented herein in the context of embodiments of GaN/AlN-based heterostructures, one skilled in the art will readily recognize that other embodiments may include one or more suitable materials such as binary ternary, or quaternary Sc, B, In, Al, or Ga-nitride alloys incorporating N-polar, In-polar, Al-polar, or Ga-polar materials having In, Al, or Ga in the crystal lattice, e.g., $(In_xAl_{1-x}N)$, $In_xGa_{1-x}N$, $Al_xGa_{1-x}N$, $In_xAl_yGa_{1-x-y}N$, where ($0<x\leq1$, $0<y\leq1$, $0<x+y\leq1$). Incorporation of Al causes the energy gap to increase; incorporation of In causes the energy gap to decrease. Heterostructures in accordance with the present invention can also include other suitable materials that exhibit spontaneous polarization or can form a 2DEG or 2DHG, such as ZnO, BeO, InN, $LiNbO_3$. See F. Bernardini et al, "Spontaneous polarization and piezoelectric constants of III-V nitrides," Phys. Rev. B 56, 10024(R); W. Troy et al, "Spontaneous Polarization Calculations in Wurtzite I1-Oxides, III-Nitrides, and SiC Polytypes through Net Dipole Moments and the Effects of Nanoscale Layering," *Nanomaterials* 11, no. 8: 1956 (2021); S. B. Cho et at, "Epitaxial engineering of polar $\varepsilon$-$Ga_2O_3$ for tunable two-dimensional electron gas at the heterointerface," *Appl. Phys. Lett.* 112, 162101 (2018); P. Ranga et al, "Highly tunable, polarization-engineered two-dimensional electron gas in $\varepsilon$-AlGaO3/$\varepsilon$-Ga2O3 heterostructures," *Applied Physics Express* 13, 061009 (2020); and W. Li et al, "Two-dimensional carrier gas at complex oxide interfaces: Control of functionality," *Journal of Applied Physics* 130, 024103 (2021). Other materials that can be used include epsilon-phase (Al, In)$Ga_2O_3$, 2H—SiC, and $LaAlO_3$, where structures such as $LaAlO_3$/$SrTiO_3$ heterojunctions formed from such materials can lead to the formation of a 2DEG and/or a 2DHG at their interface, and oxides such as $BaTiO_3$ and $PbTiO_3$. See G. Singh-Bhalla, et al, "Built-in and induced polarization across $LaAlO_3$/$SrTiO_3$ heterojunctions," *Nature Phys.* 7, 80-86 (2011); and M. Noor-A-Alam, et al., "Ferroelectricity and Large Piezoelectric Response of AlN/ScN Superlattice, *ACS Applied Materials & Interfaces* 2019 11 (22), 20482-20490. In still other embodiments, one of the materials used in the heterostructure may be non-polar, i.e., have a polarity at or near zero. These and any other suitable materials, heterostructures formed therefrom, and methods for forming such heterostructures in accordance with the spirit of the present disclosure are deemed to be within the scope of the present invention.

The purpose of the proposed invention is to dramatically increase the power density of microwave devices via a new approach to heterostructure synthesis to simultaneously achieve high breakdown voltage, high carrier density and high carrier mobility/velocity as well as overcoming current thermal limitations. The disclosed concept, in this embodiment for lateral transport applications, gives tremendous flexibility to microwave device designers by eliminating the restraint of the epitaxial barrier layer "critical thickness" and all the aforementioned challenges it presents. Other devices that may benefit from the present invention include power switching transistors, power rectifiers, and other high power semiconductor devices.

Prior examples of the thin AlN/GaN heterojunction have shown very high sheet charge and good mobility but suffered low breakdown voltage due to the limited thickness of the AlN barrier. See A. M. Dabiran et al, "Very high channel conductivity in low-defect AlN/GaN high electron mobility transistor structures," *Appl. Phys. Lett.* 93, 082111 (2008). In accordance with the present invention, device designers can leverage arbitrary layer thicknesses and optimize the device structure for the application.

As noted above, every nitride-based high electron mobility transistor (HEMT) device currently in use consists of a thin, strained heteroepitaxial barrier expected to generate sufficient spontaneous and piezoelectric polarization to support the formation of a two-dimensional electron gas (2DEG) or two-dimensional hole gas (2DHG) channel having high carrier density and high carrier mobility in such devices, with such devices having high breakdown voltage and high reliability while simultaneously being constrained by high piezoelectric stress, high electric field, and high temperature near the surface caused by the presence of the barrier layer. The present invention gives tremendous flexibility to microwave device designers by eliminating the restraint of the epitaxial barrier layer "critical thickness" and all the aforementioned challenges it presents. Although the present invention is often described herein in the context of embodiments for lateral transport applications, one skilled in the art will readily understand that the structure and method described herein can be used to fabricate electronic devices suitable for numerous other applications.

The present invention builds on the work of the inventors described above regarding crystal growth of nitride semiconductors, particularly AlN and GaN, laser lift-off of such nitride semiconductors from their growth substrates and bonding thereof to new substrates, and wafer bonding of nitride semiconductors to one another to provide a method for forming heterogeneous nitride heterostructures having engineered polarities that can provide significant improvement in breakdown voltage, thermal management, and carrier density/mobility over existing semiconductor structures.

The present invention provides a method for forming a nitride-based heterostructure by means of atomic layer bonding without the use of any interfacial layers as has previously been required for bond formation.

Formation of III-N heterostructures via the traditional epitaxial growth approach inherently leads to piezoelectric polarization due to lattice mismatch in the III-N layers. Although the presence of this polarization increases charge density, it also introduces reliability concerns at high electric fields due to defects that may form under piezoelectrically induced stress. See J. A. del Alamo et al, "GaN HEMT reliability," *Microelectronics Reliability* 49, 1200 (2009).

The approach in accordance with the present invention avoids the lattice mismatch issue altogether, paving the way for the formation of robust, highly reliable, high power III-N heterostructures.

The absence of piezoelectric polarization is not a detriment to this invention because strong spontaneous polarizations ($P_{SP}$) in III-nitride layers results in high sheet charge. Thicker layers will also result in less surface-sensitive channel and reduced need for passivation as the channel is further isolated from the heterostructure surface.

The present invention thus enables the formation of direct bonded AlN/GaN HFET heterostructures having a much higher breakdown voltage leading to increase in power density at X-band. See S. H. Sohel et al, "X-Band Power and Linearity Performance of Compositionally Graded AlGaN Channel Transistors," *IEEE Electron Device Letters*, Vol. 39, No. 12, December 2018. See also X. Luo et al, "Scaling and high-frequency performance of AlN/GaN HEMTs,"

2011 *IEEE International Symposium on Radio-Frequency Integration Technology* 2011, pp. 209-212.

As described in more detail below, the overall bonding approach used in accordance with the present invention uses direct wafer bonding to join two III-nitride materials. In many cases, bonding can be accomplished at low temperatures, low bonding force that allow such bonding to be conducted on a wafer-scale.

Direct wafer bonding as used in accordance with the present invention requires that the surfaces of the two wafers be smooth and flat, with a root mean square (RMS) roughness of less than 0.5, and be exceptionally clean and free of contaminants and particles. The wafer surfaces typically also must be activated such that the wafers are attracted to each other. This can be done by chemical treatments that leave active species of e.g., OH$^-$ or H$^+$ bound to the surface. Such species produce a van der Waal bond that attracts the wafer surfaces and closes the gap.

Following wafer bonding, thermal annealing is required to drive out the reaction gases and produce covalent bonds at the bond interface. Other methods of activation, which result in immediate covalent bonding, include exposure to an energetic plasma of e.g., nitrogen, argon, ammonia, or chlorine gases. Exposure to a plasma creates dangling bonds on the surface that are attracted to dangling bonds on the opposite surface.

Joining these two activated surfaces results in immediate covalent bonding at room temperature. The plasma energy and duration of exposure must be controlled to avoid substantial damage to the wafer surfaces. Some level of damage can be removed by thermal annealing following bonding. Another approach to surface activation is the use of fast atom beams of e.g., argon ion beams. Similar to plasma exposure, conditions must be controlled as to avoid substantial damage. In the case of plasma or fast atom beam, activation and wafer bonding could take place in a suitable vacuum chamber such that the wafer surfaces are not exposed to air after activation and prior to bonding.

As noted above, the present invention builds on the success of the inventors' previous approaches regarding bonding of semiconductor structures, and uses direct bonding of GaN to AlN without a dielectric interlayer to exploit the spontaneous polarization of both GaN and AlN and thus benefits from intimate contact between the GaN and AlN. Using this approach, the heterogeneous nitride heterostructures produced in accordance with the present invention can leverage the electronic properties of the combined polarization at the interface to produce a robust heterostructure with high carrier densities.

The key to the disclosed invention is the use of direct wafer bonding of strain-relaxed AlN and GaN layers to achieve a spontaneous-polarization induced charge density 2-3 times that in conventional AlGaN/GaN HEMTs. As shown in Table I of O. Ambacher et al, "Two dimensional electron gases induced by spontaneous and piezoelectric polarization in undoped and doped AlGaN/GaN heterostructures," *J. Appl. Phys.*, Vol. 87, No. 1, pp. 334-344 (2000), the spontaneous and piezoelectric polarization constants of AlN are nearly three times as high as those of GaN; specifically, the spontaneous polarization constants of GaN and AlN are listed as $-0.029$ and $-0.081$ C/m$^2$, respectively. This negative sign of the spontaneous polarization is for a cation (Ga or Al)-polar crystal orientated along the [0001] axis, whereas the spontaneous polarization constants of an N-polar GaN or AlN, orientated along the [000-1] axis, would be positive, i.e., +0.029 and +0.081 C/m$^2$, respectively.

To maintain charge neutrality, charge (negative electrons or positive holes) of the opposite sign of the polarization charge will accumulate at the interface. The signs of the GaN and AlN polarization charges are both negative for cation (Ga or Al)-polar material and both positive for N-polar material. Thus, the largest difference in spontaneous polarization occurs at the interface of GaN and AlN materials of the opposite polar orientation. The net spontaneous polarization charge and the resulting formation of a 2DEG or a 2DHG at the interface of GaN and AlN is determined by the difference in the spontaneous polarization constants $P_{SP}$ of the two orientation-dependent materials, with a net positive difference being indicative of the formation of a 2DEG and a net negative difference being indicative of a 2DHG.

Figure 7A:
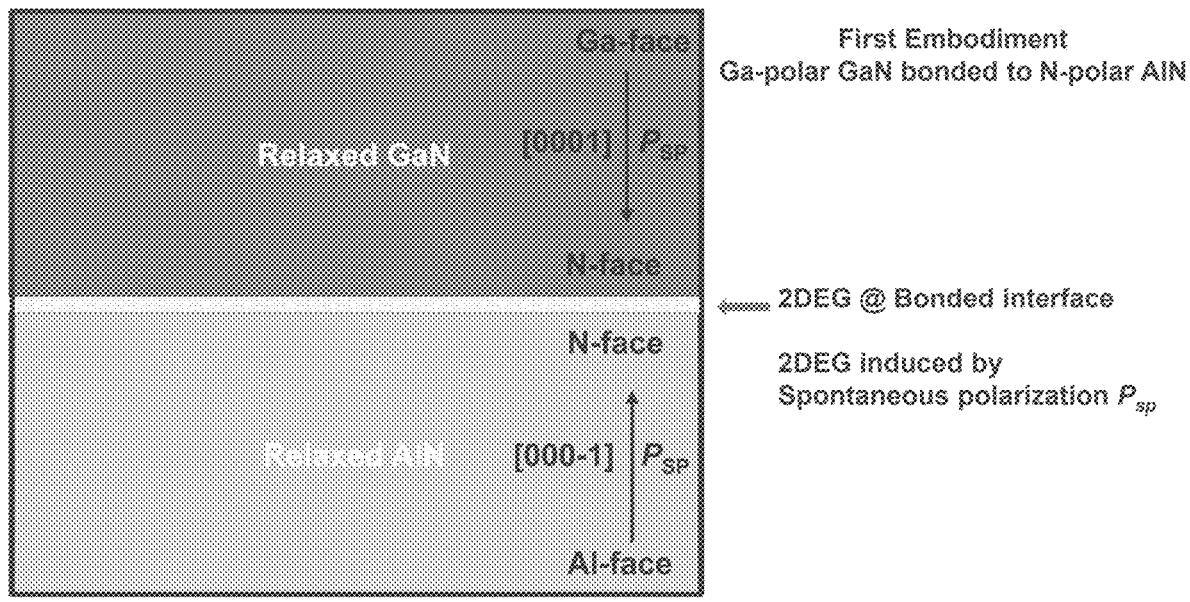
FIGS. 7A-7B illustrate aspects of the polarity and performance of a first exemplary embodiment of an AlN/GaN heterostructure having strain-relaxed bonded interfaces and a 2DEG formed in accordance with the present invention.

FIGS. 7A/7B, 8A/8B, 9A/9B, and 10A/10B illustrate aspects of four different exemplary embodiments of a GaN/AlN HEMT formed by direct bonding of polar GaN and polar AlN in accordance with the present invention. As shown in these FIGURES, depending on the polar orientation of the initial GaN and AlN layers, the spontaneous polarization $P_{SP}$ induced by the bonding of these material will produce a 2DEG or a 2DHG at the bonded interface between them. In accordance with the present invention, the semiconductor materials and the orientation of the bonded surfaces of the semiconductor materials relative to their respective polarity can be selected to produce a predetermined 2DEG or 2DHG at the interface between the bonded first and second semiconductor material layers.

Figure 7B:
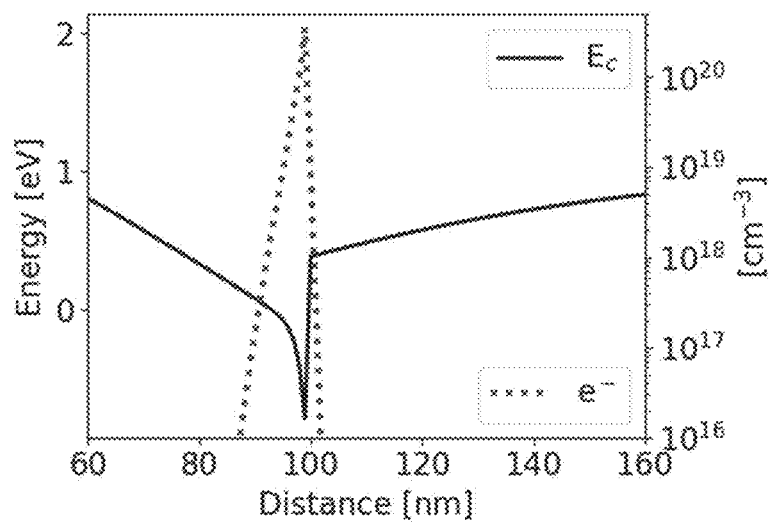

Thus, in a first exemplary embodiment, aspects of which are shown by the block schematic in FIG. 7A, the N-face of strain-relaxed [0001] Ga-polar oriented GaN is bonded to the N-face of strain-relaxed [000-1] N-polar oriented AlN. This bonding of Ga-polar GaN on N-polar AlN produces a heterostructure having GaN and AlN layers whose spontaneous polarizations $P_{SP}$ are $-0.029$ and $+0.081$ C/m$^2$, respectively. In this case, as shown by the plot of simulated energy-band diagrams in FIG. 7B, the difference in spontaneous polarizations $P_{SP}$ for [0001] Ga-polar GaN on [000-1] N-polar AlN is positive, i.e., ((+0.081)−(−0.029)), reflecting the formation of a two-dimensional electron gas (2DEG) having an electron concentration as high as $10^{20}$ cm$^{-3}$ at the GaN/AlN interface. This high electron concentration makes devices having this GaN/AlN structure particularly suitable for use in HEMTs and HFETs.

Figure 8A:
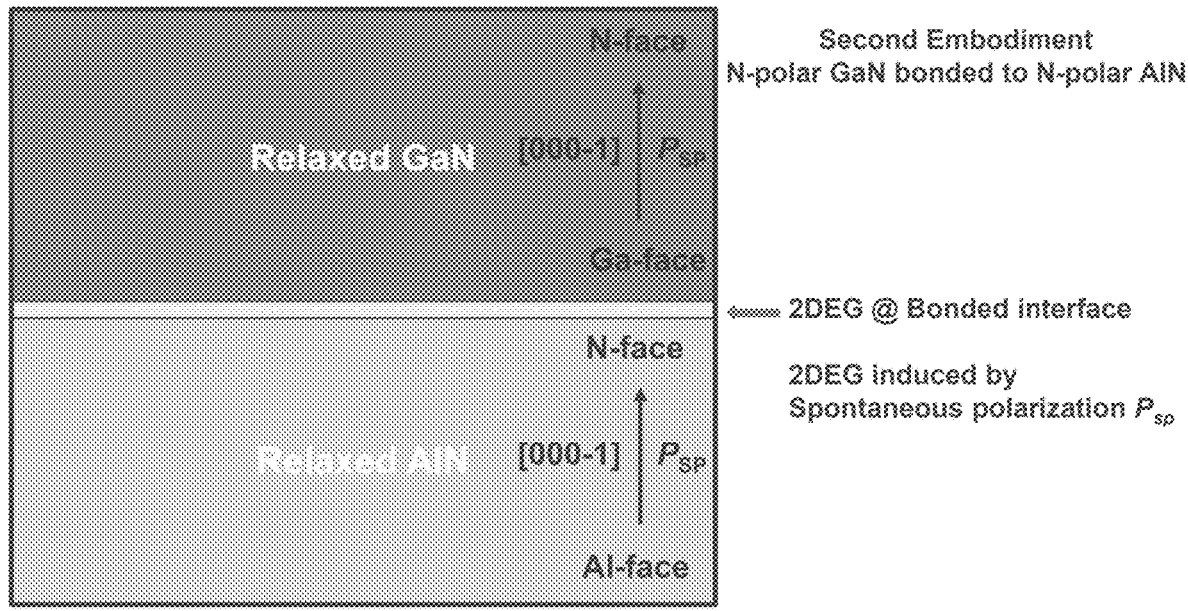
FIGS. 8A-8B illustrate aspects of the polarity and performance of a second exemplary embodiment of an AlN/GaN heterostructure having strain-relaxed bonded interfaces and a 2DEG formed in accordance with the present invention.
Figure 8B:
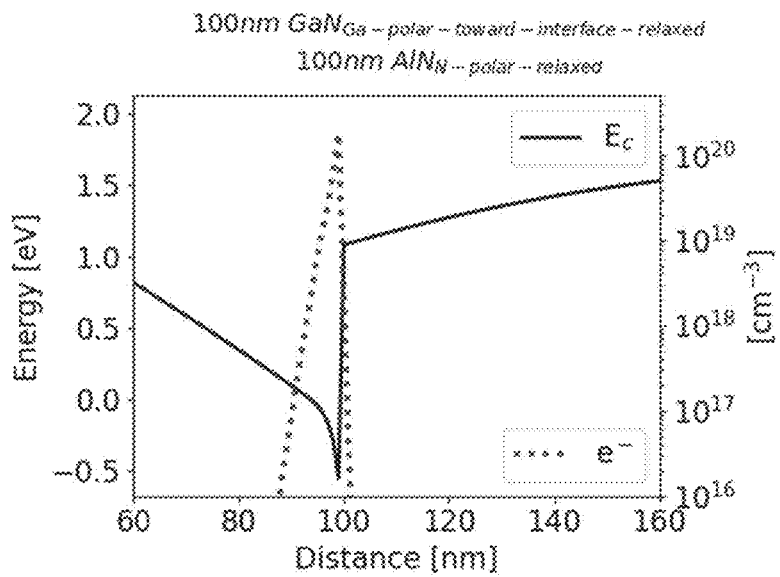

In a second exemplary embodiment, aspects of which are shown by the block schematic in FIG. 8A, the Ga-face of strain-relaxed [000-1] N-polar GaN is bonded to the N-face of strain-relaxed [000-1] N-polar AlN. As with the first exemplary embodiment shown in FIGS. 7A/7B, in this case the difference in the spontaneous polarization constants of the GaN and AlN layers also is positive, i.e., ((+0.081)−(+0.029)), reflecting the formation of a two-dimensional electron gas (2DEG) at the GaN/AlN interface. As shown by the plot in FIG. 8B, the 2DEG in this configuration also has an electron concentration as high as $10^{20}$ cm$^{-3}$, making devices having this GaN/AlN structure also particularly suitable for use in HEMTs and HFETs.

Figure 9A:
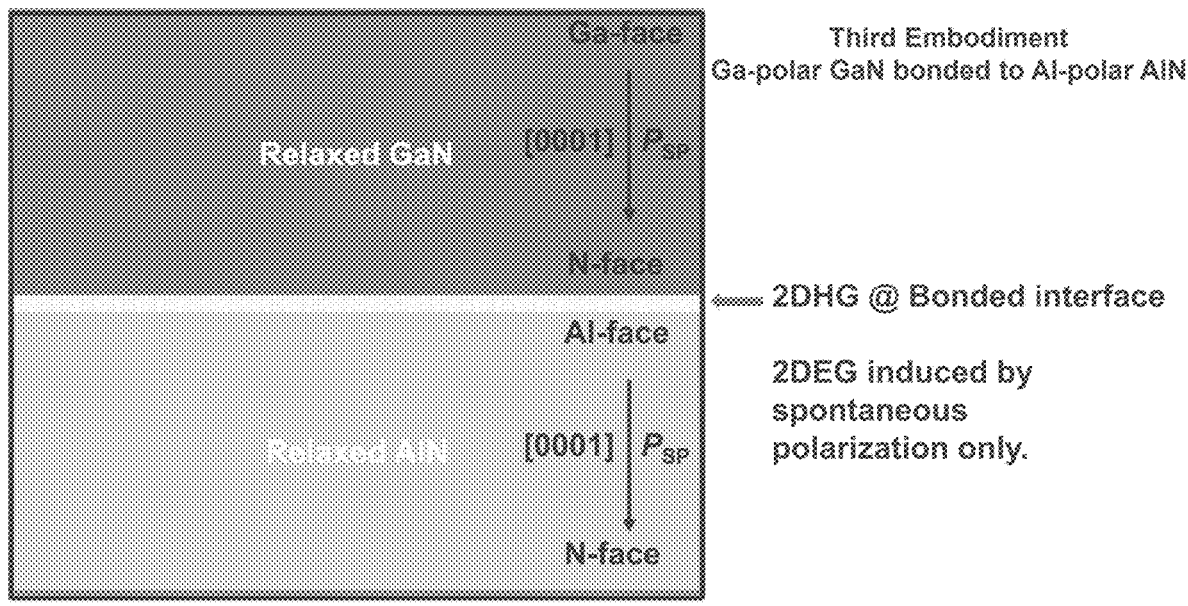
FIGS. 9A-9B illustrate aspects of the polarity and performance of a third exemplary embodiment of an AlN/GaN heterostructure having strain-relaxed bonded interfaces and a 2DHG formed in accordance with the present invention.
Figure 9B:
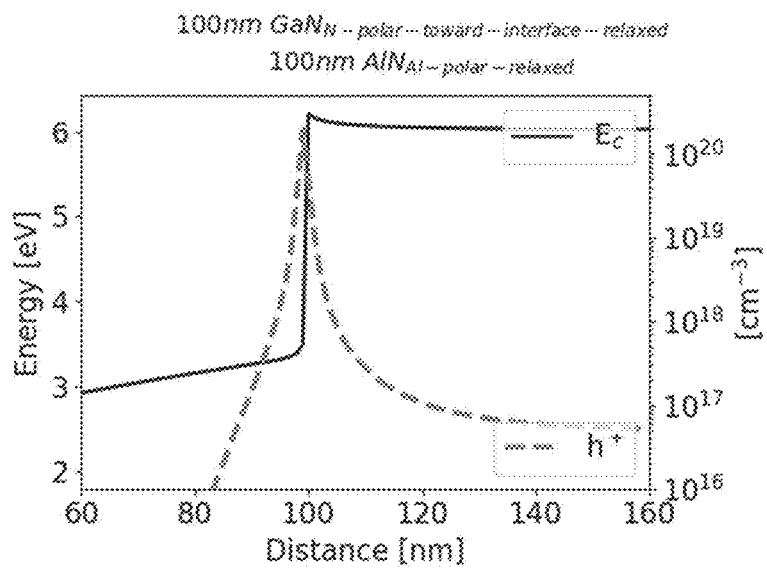

In a third exemplary embodiment, aspects of which are shown by the block schematic in FIG. 9A, the N-face of a strain-relaxed [0001] Ga-polar GaN layer is bonded to the Al-face of a strain-relaxed [0001] Al-polar AlN layer. The spontaneous polarization constants $P_{SP}$ of the GaN and AlN layers as described above, but in this case their difference is negative, i.e., ((−0.081)−(−0.029)), reflecting the formation of a two-dimensional hole gas (2DHG) at the bonding interface between them. As shown in the plot in FIG. 9B, this 2DHG at the GaN/AlN interface has a hole concentration as high as $10^{20}$ cm$^{-3}$, making devices having this GaN/AlN structure particularly suitable for applications in which hole-based charge transport is required, particularly in complementary metal-oxide-semiconductor (CMOS) devices.

Figure 10A:
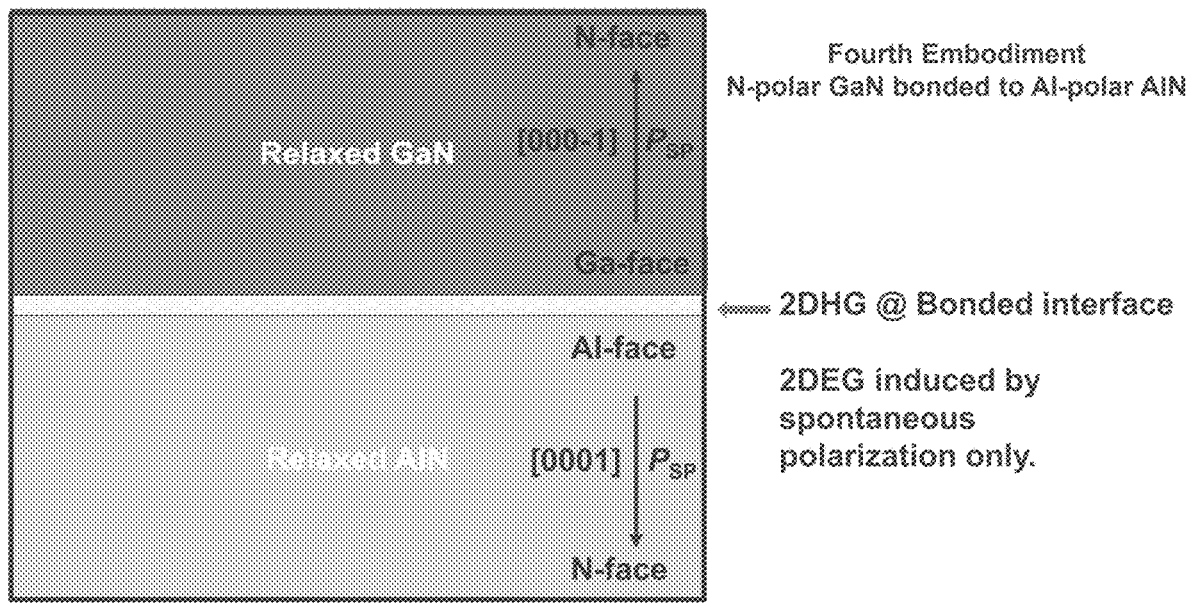
FIGS. 10A-10B illustrate aspects of the polarity and performance of a fourth exemplary embodiment of an AlN/GaN heterostructure having strain-relaxed bonded interfaces and a 2DHG formed in accordance with the present invention.
Figure 10B:
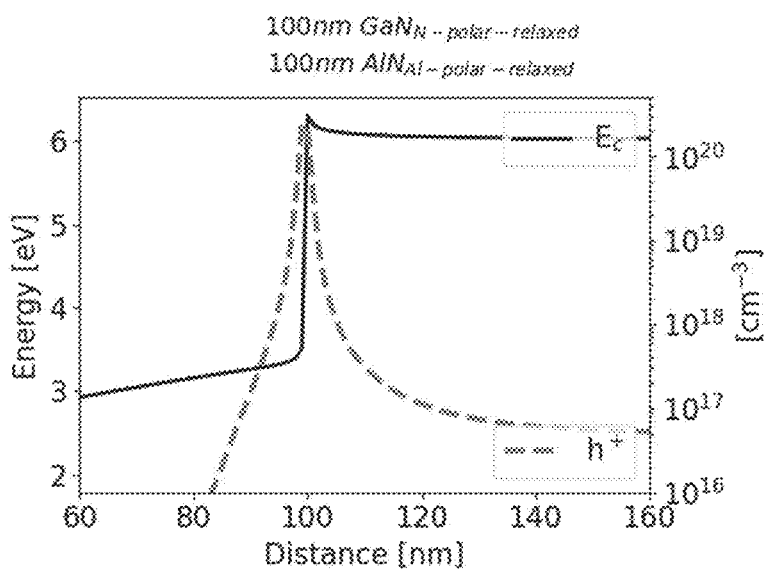

Finally, in a fourth exemplary embodiment, aspects of which are shown by the block schematic in FIG. 10A, the Ga-face of a strain-relaxed [000-1] N-polar GaN layer is bonded to the Al-face of a strain-relaxed [0001] Al-polar AlN layer. In this case as in the third embodiment described above, the difference in spontaneous polarization $P_{SP}$ constants of the GaN and AlN layers, i.e., ((−0.081)−(+0.029)) is negative, reflecting the formation of a two-dimensional hole gas (2DHG) at the AlN/GaN interface, as shown by the plot in FIG. 10B. As with the GaN/AlN heterostructures in accordance with the third embodiment described above, the hole concentration in this 2DHG is as high as $10^{20}$ cm$^{-3}$, making devices having the GaN/AlN structure in accordance with this embodiment also particularly suitable for applications in which hole-based charge transport is required, particularly in CMOS devices.

Figure 11:
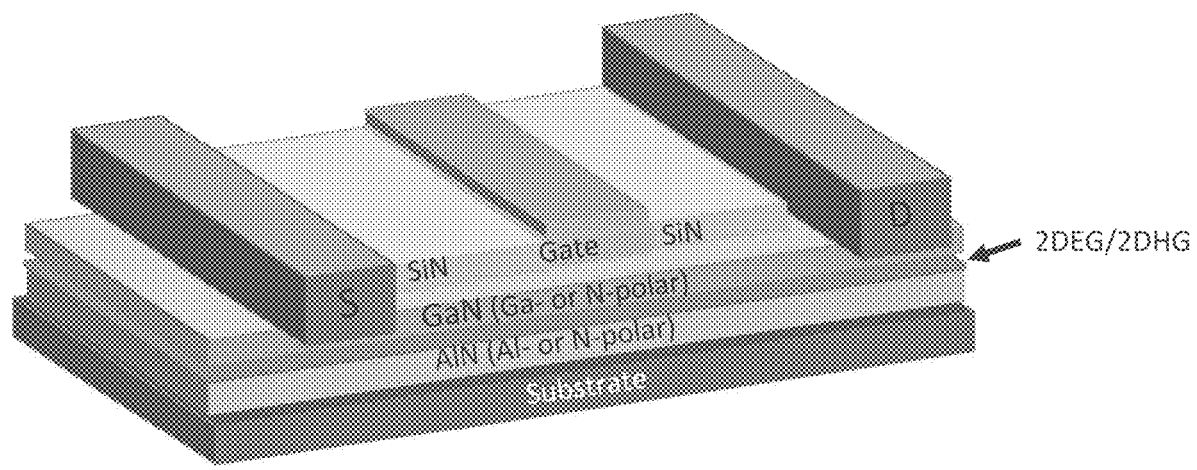
FIG. 11 is a block schematic illustrating an exemplary AlN/GaN HEMT having an embedded 2DEG or 2DHG in accordance with the present invention.

In the structures described above, the GaN material layer is "on top" such that the electrical connection is made via the GaN layer, as illustrated by the block schematic in FIG. 11. Optionally, a regrown or implanted contact process can be implemented to further reduce contact resistance.

In addition to these embodiments, structures that can be formed by direct bonding of AlN to GaN include structures in which the AlN is "on top" to form AlN/GaN HEMTs. As described below, the spontaneous polarization induced in such structures also produces 2DEGs or 2DHGs in a manner similar to that described above with respect to GaN/AlN HEMTs.

The present invention also provides methods for forming the direct-bonded AlN/GaN and GaN/AlN heterostructures described above. As noted above, the method for forming the heterostructures in accordance with the present invention relies on direct bonding of the two material layers, in which the surfaces of the two material layer films are smooth, flat, and free of contaminants and particles, with a root mean square (RMS) roughness of less than 0.5 nm. Typically, the wafer surfaces must be activated such that the wafers are attracted to each other such that joining the two activated surfaces results in immediate covalent bonding at room temperature.

The block schematics in FIGS. 12-15 illustrate exemplary method steps used to form "GaN on top" GaN/AlN heterostructures in accordance with the four exemplary embodiments described above, while the schematics in FIGS. 16-19 illustrate method steps used in formation of corresponding exemplary "AlN on top" AlN/GaN heterostructures.

In these FIGURES, except where noted, the method steps shown are the same in each FIGURE, with the reference numbers in each FIGURE following the same numbering scheme except as changed to reflect the FIGURE in which they are shown. For example, steps 1301*a*/1301*b*, 1302, etc., in FIG. 13 are the same as the corresponding steps 1201*a*/1201*b*, 1201, etc. shown and described with respect to FIG. 12. For the sake of brevity and to avoid unnecessary duplication, except as necessary to describe the steps and features of the different structures reflected in each FIGURE, the method steps will only be described in detail with respect to FIG. 12 and will not be repeated in the description of the other FIGURES.

Figure 12:
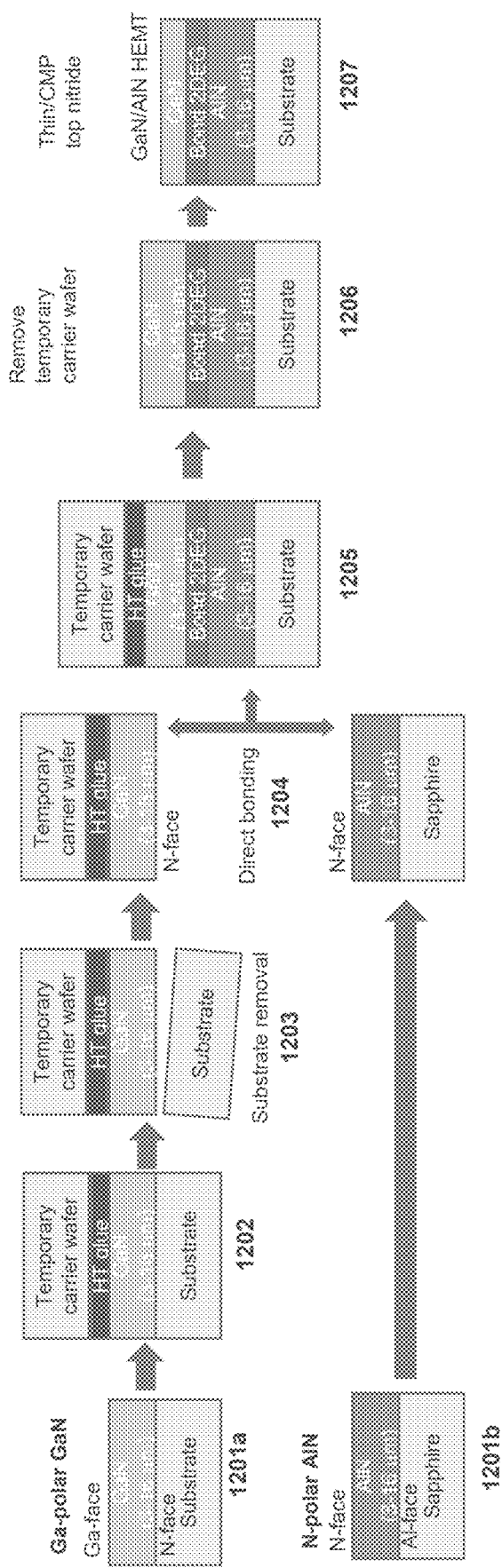
FIG. 12 is a block schematic illustrating an exemplary process flow in a method for fabricating a GaN/AlN heterostructure having strain-relaxed bonded interfaces and a 2DEG formed in accordance with the first embodiment of the present invention.
Figure 13:
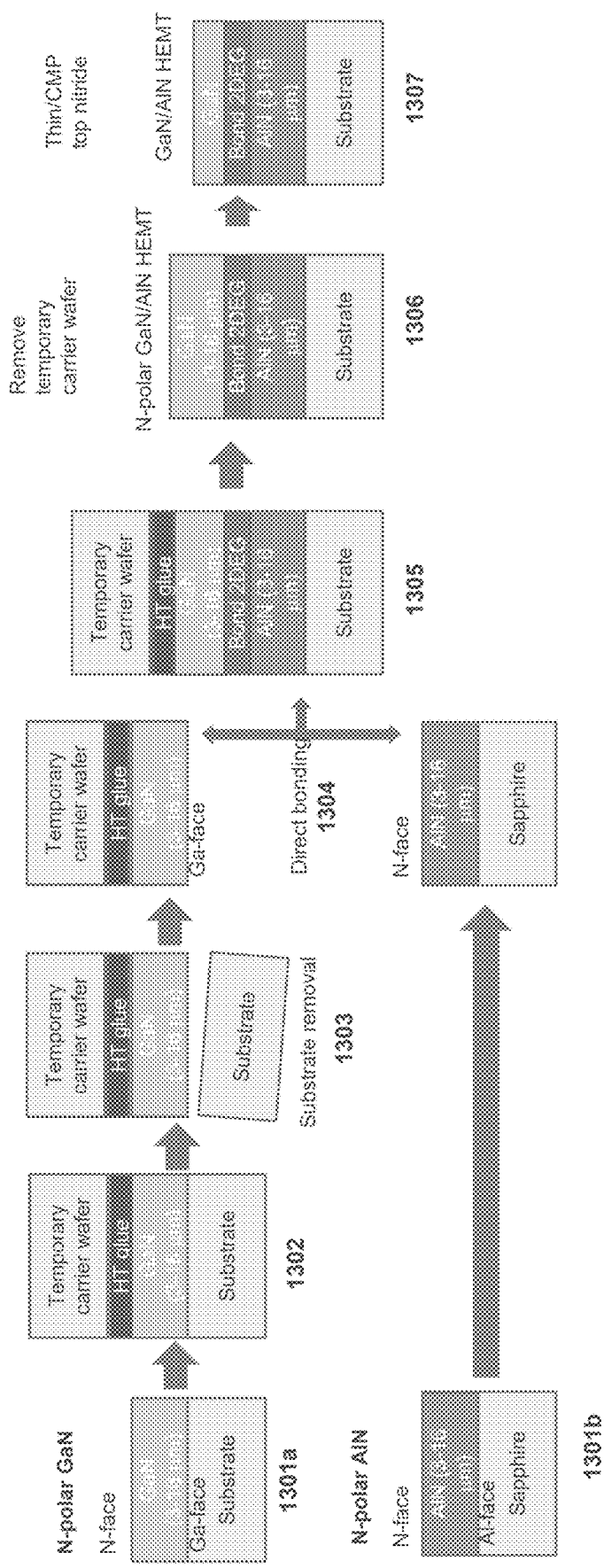
FIG. 13 is a block schematic illustrating an exemplary process flow in a method for fabricating a GaN/AlN heterostructure having strain-relaxed bonded interfaces and a 2DEG formed in accordance with the second embodiment of the present invention.

The block schematics in FIG. 12 illustrate method steps used to form the exemplary GaN/AlN heterostructure described above with respect to FIGS. 7A and 7B. As shown in FIG. 12, the method starts in steps 1201*a* with the growth of a Ga-polar GaN layer on a first substrate and in step 1201*b* with the growth of an N-polar AlN film on a second substrate. As shown in FIG. 12, the Ga-polar GaN layer is relatively thick, typically having a thickness of about 0.5 to about 15 μm. The first substrate used for the GaN layer is preferably sapphire, silicon, silicon carbide, or gallium nitride, while the second substrate used for the AlN layer is preferably sapphire, though other substrates for the GaN and the AlN layers can be used as appropriate.

In step 1202, a temporary carrier wafer is applied to the Ga-face of the Ga-polar GaN layer, e.g., using a high-temperature adhesive layer. In step 1203, the first substrate is then removed, e.g., by etching or other suitable means, leaving the N-face of the Ga-polar GaN layer exposed. The exposed faces of the GaN layer and the AlN layer are then polished and cleaned as described above to prepare them for direct bonding to one another, and in step 1204, the N-face of the Ga-polar GaN is directly bonded to the N-face of the N-polar AlN to form the single heterostructure shown in step 1205 having a 2DEG at the bonding interface as a result of the spontaneous polarization that intrinsically occurs within the Ga-polar GaN and the N-polar AlN layers.

Next, in step 1206, the temporary carrier wafer is removed from the top of the GaN/AlN heterostructure to expose the GaN layer so that electrical contact can be made to the structure. Finally, in step 1207, the GaN layer, which typically had an original thickness of, e.g., approximately 0.5-15 μm, is thinned, e.g., by chemical mechanical polishing (CMP), to a final thickness of, e.g., approximately 0.1-2 μm, so that the 2DEG at the GaN/AlN interface can be more readily accessed.

The block schematics in FIG. 13 illustrate aspects of a method for forming the GaN/AlN heterostructure described above with respect to FIGS. 8A/8B, in which an N-polar GaN layer is directly bonded to an N-polar AlN layer. The steps of this method are the same as those described above with respect to FIG. 12, except that in step 1302 shown in FIG. 13, the temporary carrier wafer is applied to the N-face of the GaN layer and the Ga-face of the GaN is directly bonded to the N-face of the AlN in step 1304 to form a GaN/AlN heterostructure having a 2DEG at the interface between the GaN and the AlN layers.

Figure 14:
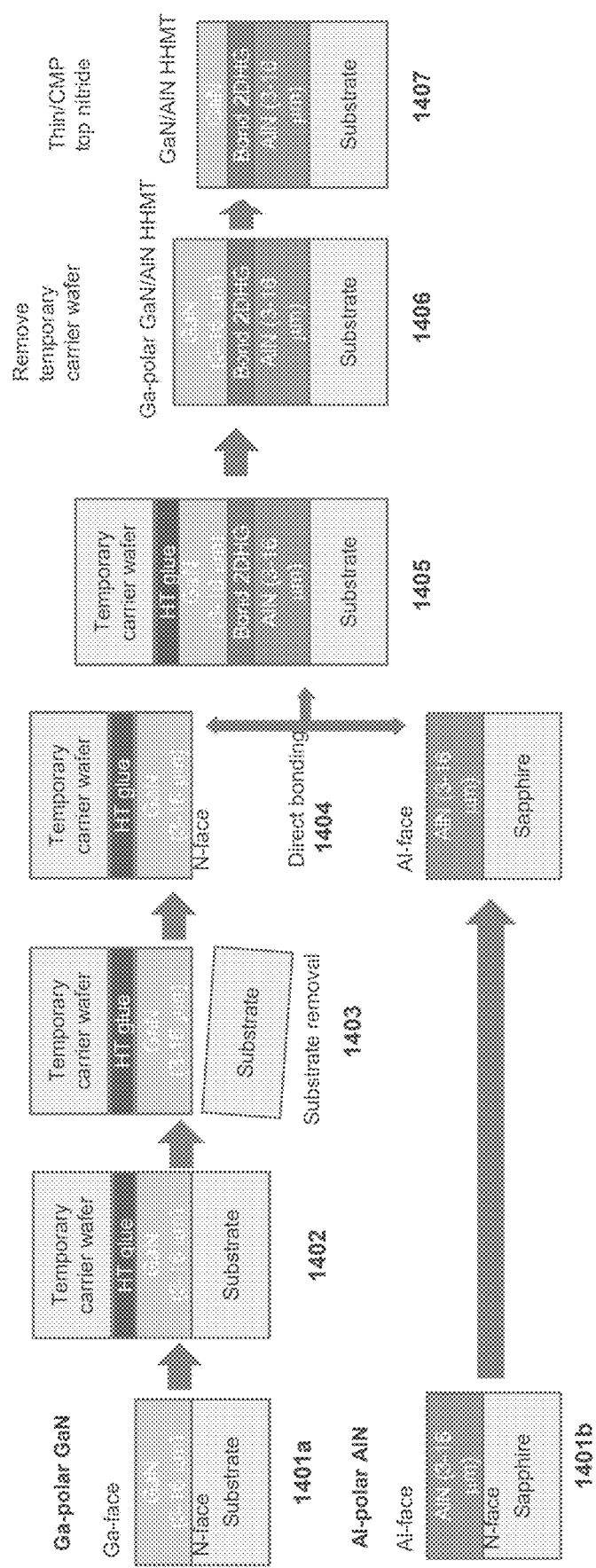
FIG. 14 is a block schematic illustrating an exemplary process flow in a method for fabricating a GaN/AlN heterostructure having strain-relaxed bonded interfaces and a 2DHG formed in accordance with the third embodiment of the present invention.

The block schematics in FIG. 14 illustrate aspects of a method for forming the GaN/AlN heterostructure described above with respect to FIGS. 9A/9B, in which a Ga-polar GaN layer is directly bonded to an Al-polar AlN layer. The steps of this method are the same as those described above with respect to FIG. 12, except that in in step 1404, the N-face of the Ga-polar GaN is directly bonded to the N-face of the AlN to form the GaN/AlN heterostructure. As described above with respect to FIG. 9A/9B, in this case, the GaN/AlN heterostructure has a 2DHG at the interface of the GaN and AlN layers as a result of the spontaneous polarization induced by the direct bonding of the two materials.

Figure 15:
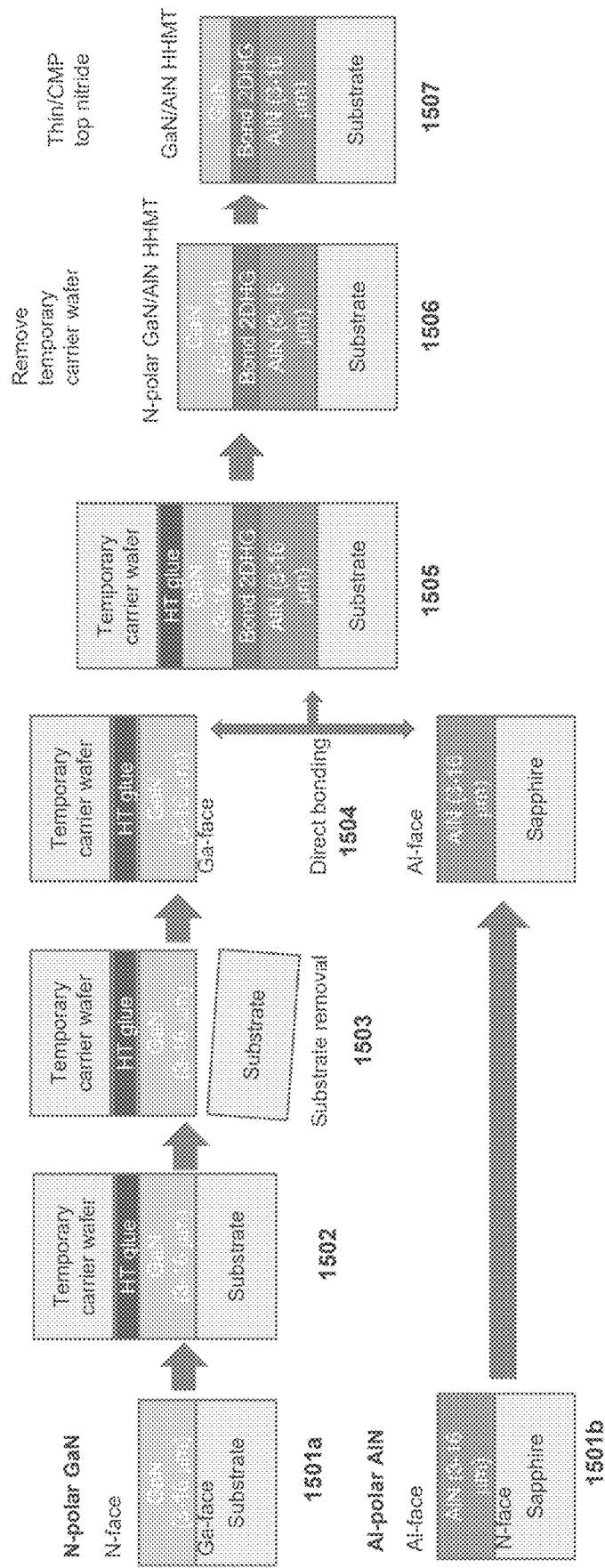
FIG. 15 is a block schematic illustrating an exemplary process flow in a method for fabricating a GaN/AlN heterostructure having strain-relaxed bonded interfaces and a 2DHG formed in accordance with the fourth embodiment of the present invention.

Finally, the block schematics in FIG. 15 illustrate aspects of a method for forming the GaN/AlN heterostructure described above with respect to FIGS. 10A/10B, in which an N-polar GaN layer is directly bonded to an Al-polar AlN layer. As with the other method FIGURES noted above, the method steps shown in FIG. 15 are the same as those described above with respect to FIG. 12, except that in in step 1502, the temporary carrier wafer is applied to the N-face of the GaN layer and in step 1504, the Ga-face of the Ga-polar GaN is directly bonded to the Al-face of the AlN to form the GaN/AlN heterostructure. As described above with respect to FIG. 10A/10B, in this case, the GaN/AlN heterostructure has a 2DHG at the interface of the GaN and AlN layers as a result of the spontaneous polarization induced by the direct bonding of the two materials.

As noted above, in addition to the GaN/AlN heterostructures described above, structures that can be formed by directly bonding polar GaN to polar AlN include "AlN on top" AlN/GaN heterostructures. These structures generally correspond to the structures shown in FIGS. 7-10 above, but with the layers reversed.

The block schematics in FIGS. 16-19 illustrate aspects of the formation of these heterostructures. As with FIGS. 12-15 above, except where noted, the method steps shown are the same in each FIGURE, with the reference numbers in each FIGURE following the same numbering scheme except as changed to reflect the FIG. 1*n* which they are shown, and the sake of brevity and to avoid unnecessary duplication, except as necessary, the method steps will only be described in detail with respect to FIG. 16 and will not be repeated in the description of the other FIGURES.

Figure 16:
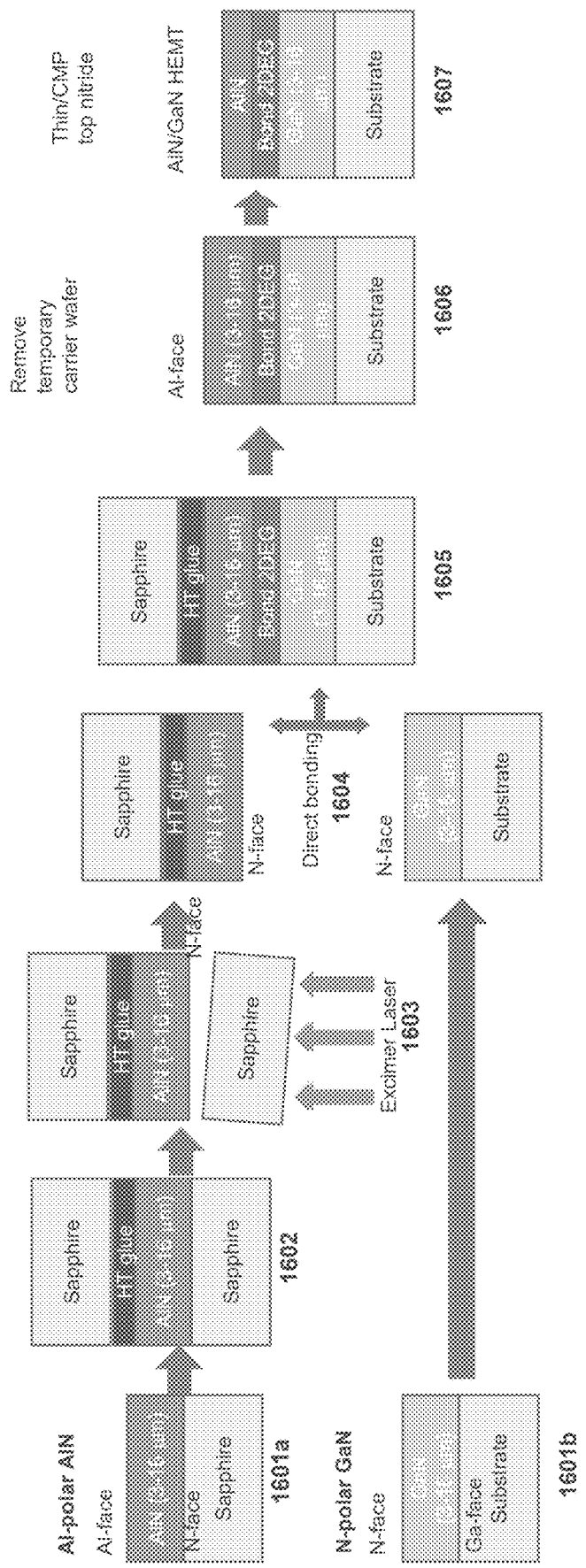
FIG. 16 is a block schematic illustrating an exemplary process flow in a method for fabricating an AlN/GaN heterostructure having strain-relaxed bonded interfaces and a 2DEG formed in accordance with another exemplary embodiment of the present invention.

Thus, the block schematics in FIG. 16 illustrate aspects of a method for forming a structure in which Al-polar AlN is directly bonded to N-polar GaN. In this case, in step 1601*a*, a thick (e.g., approximately 0.5-15 µm) Al-polar AlN material layer is grown on a substrate and in step 1601*b*, a thick (e.g., approximately 0.5-15 µm)N-polar GaN material layer is grown on a substrate. As with the "GaN on top" embodiments described above, in most cases, the AlN layer is grown on sapphire, while the GaN layer is grown on sapphire, silicon, silicon carbide, or gallium nitride, although other substrates can be used as appropriate.

In step 1602, a temporary carrier layer, also typically sapphire, is applied to the Al-face of the AlN layer by means of a high-temperature adhesive layer. In step 1603, the initial sapphire substrate is then removed from the AlN layer, e.g. through use of an excimer laser, to expose the N-face of the Al-polar AlN layer.

In step 1604, the exposed N-face of the AlN layer is directly bonded to the N-face of the GaN layer to form a GaN/AlN heterostructure shown at step 1605 in which the AlN layer is on top and a 2DEG is formed at the AlN/GaN interface.

At step 1606, the sapphire temporary carrier layer and adhesive layer are removed to expose the Al-face of the top AlN layer, and finally, at step 1607, the AlN layer is thinned, e.g., by means of chemical mechanical polishing or other appropriate means, so that contact to the 2DEG can be easily accomplished.

Figure 17:
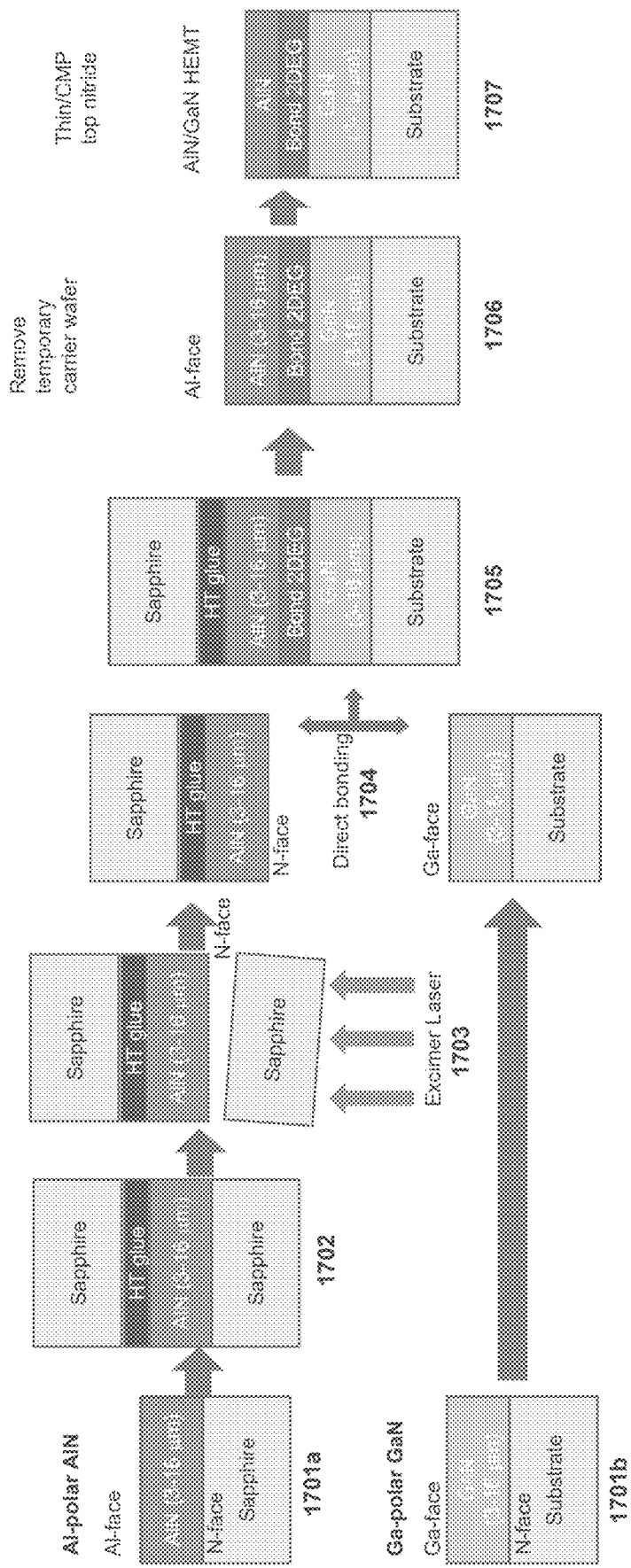
FIG. 17 is a block schematic illustrating an exemplary process flow in a method for fabricating an AlN/GaN heterostructure having strain-relaxed bonded interfaces and a 2DEG formed in accordance with another exemplary embodiment of the present invention.

The block schematics in FIG. 17 illustrate aspects of a method for forming an AlN/GaN heterostructure in which an Al-polar AlN layer is directly bonded to a Ga-polar GaN layer. The steps of this method are the same as those described above with respect to FIG. 16, except that the Ga-face of the GaN is directly bonded to the N-face of the AlN in step 1704 to form an AlN/GaN heterostructure having a 2DEG at the AlN/GaN interface.

Figure 18:
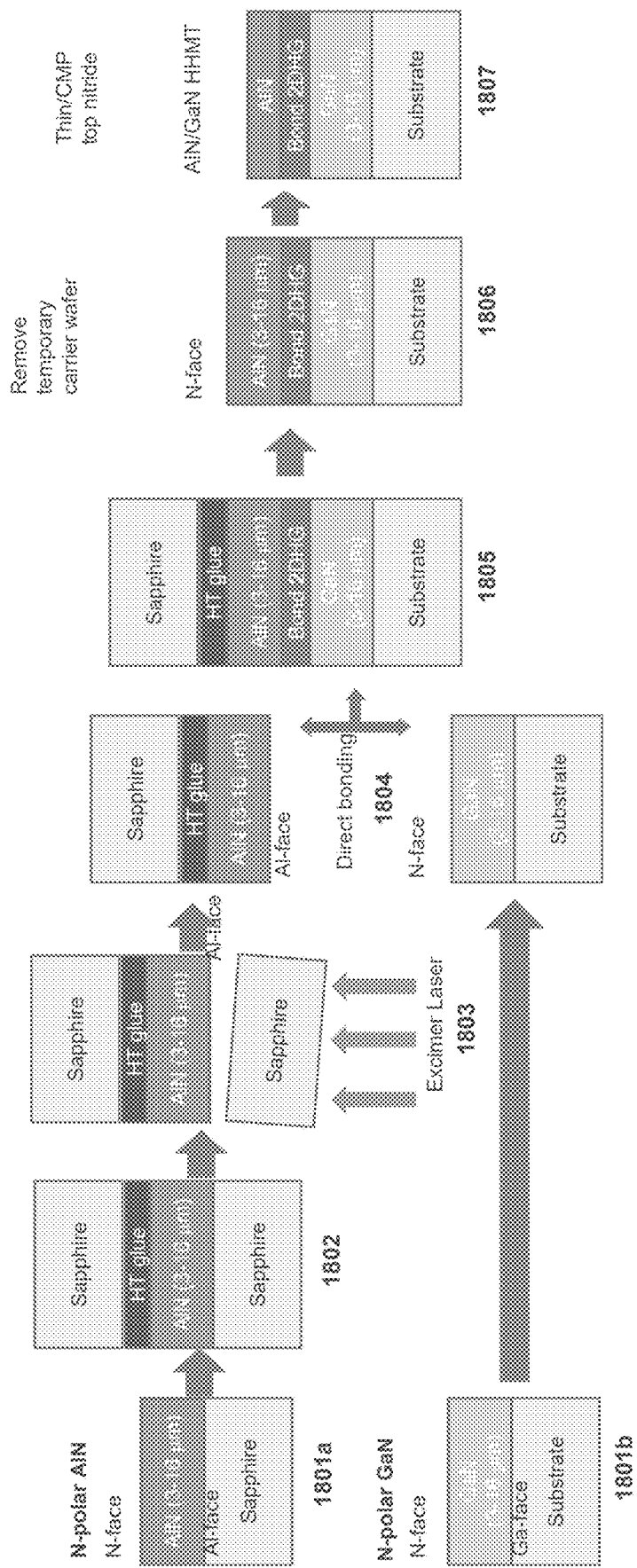
FIG. 18 is a block schematic illustrating an exemplary process flow in a method for fabricating an AlN/GaN heterostructure having strain-relaxed bonded interfaces and a 2DHG formed in accordance with another exemplary embodiment of the present invention.

The block schematics in FIG. 18 illustrate aspects of a method for forming an AlN/GaN heterostructure in which an N-polar AlN layer is directly bonded to an N-polar GaN layer. The steps of this method are the same as those described above with respect to FIG. 16, except that the Al-face of the AlN layer is exposed when the sapphire substrate is removed from the N-polar AlN layer such that the Al-face of the AlN layer is directly bonded to the N-face of the GaN in step 1804 to form the AlN/GaN heterostructure shown in step 1805, with the spontaneous polarizations $P_{SP}$ of the AlN and GaN layers producing a 2DHG at the AlN/GaN interface.

Figure 19:
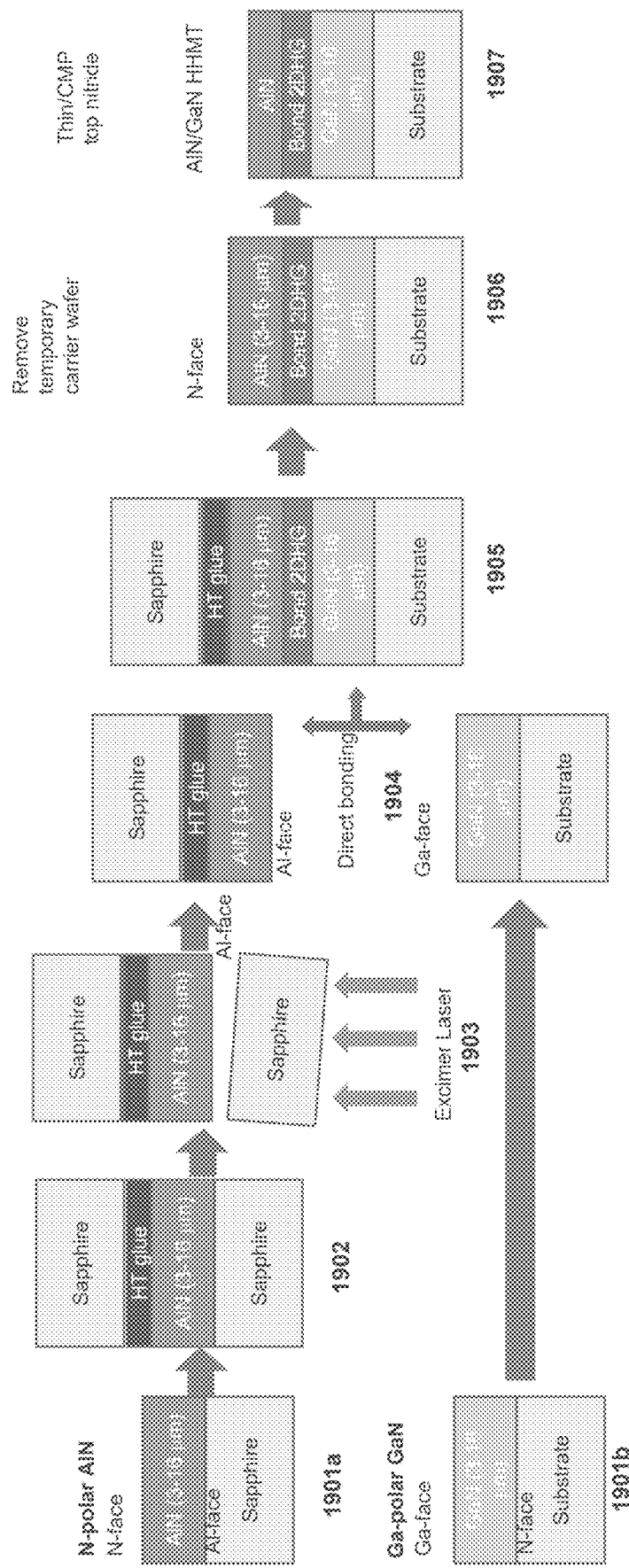
FIG. 19 is a block schematic illustrating an exemplary process flow in a method for fabricating an AlN/GaN heterostructure having strain-relaxed bonded interfaces and a 2DHG formed in accordance with another exemplary embodiment of the present invention.

Finally, the block schematics in FIG. 19 illustrate aspects of a method for forming an AlN/GaN heterostructure in which N-polar AlN is directly bonded to Ga-polar GaN. As with the other method FIGURES noted above, the method steps shown in FIG. 19 are the same as those described above with respect to FIG. 16, except that in in step 1902, the sapphire temporary carrier is applied to the N-face of the AlN layer. In step 1903, the sapphire substrate is removed to expose the Al-face of the AlN layer so that the Al-face of the AlN layer is directly bonded to the Ga-face of the GaN layer in step 1904 to form the AlN/GaN heterostructure shown in step 1905, with the spontaneous polarizations $P_{SP}$ of the AlN and GaN layers producing a 2DHG at the AlN/GaN interface.

Advantages and New Features

The present disclosure describes semiconductor devices that leverage the strong spontaneous polarization of the GaN/AlN heterostructure formed by joining strain-relaxed GaN and AlN epitaxial films by direct wafer bonding along specific crystallographic directions. Bonding the N-polar of AlN with the N-polar of GaN, for example, exhibits the advantage of (1) strong spontaneous polarization to generate a 2DEG charge density estimated to be $3.17 \times 13$ cm$^{-2}$ (see Ambacher et al, supra); (2) high electric field capability up to 5 MV/cm (see I. Abid et al, "High Lateral Breakdown Voltage in Thin Channel AlGaN/GaN High Electron Mobility Transistors on AlN/Sapphire Templates," *Micromachines* 2019, 10(10), 690); (3) reduced piezoelectric stress leading to reduced stress-related device failure; (4) thicker AlN barrier with less sensitivity to surface effects easing passivation requirements; and (5) higher composite thermal conductivity approaching that of bulk AlN (see Koh et al, supra).

The spontaneous polarization which generates a high 2DEG charge should lead to more reliable AlN/GaN HEMTs with mobility greater than 1500 cm$^2$/(V-s), breakdown field approaching 5 MV/cm, and defect density at the heterogeneous heterojunction <$1 \times 10^{10}$ cm$^{-2}$ for next-generation very high-power devices. Alternate bonding orientations are also quite intriguing—for example, a 2DHG is possible with Al-polar AlN bonded to GaN, which in turn, could potentially enable the development of GaN-based CMOS devices.

Alternatives

Today, every nitride-based high electron mobility transistor (HEMT) device consists of a thin, strained heteroepitaxial barrier expected to generate sufficient spontaneous and piezoelectric polarization to support the 2DEG channel with high density, high mobility, high breakdown voltage, and high reliability, while simultaneously constrained by high piezoelectric stress, high electric field, and high temperature near the surface.

The final device structures in accordance with the present invention will comprise these µm-thick layers of the GaN and AlN. Other bulk substrates can be lapped and polished, but the lift-off approach with the sapphire-based structures provides a facile means to transfer layers having ~µm thickness. AlN layers deposited on sapphire exhibit higher thermal conductivity than layers on other bulk substrates, thus improving the heat transfer from the device-active regions. In addition, growth on sapphire provides a more scalable process than for GaN and AlN substrates, (although combinations such as a bulk GaN substrate and an AlN layer on sapphire can readily be incorporated in this approach). Once bonded and thinned on the GaN side, device fabrication follows established HEMT device fabrication protocols, e.g., mesa etch, regrowth of n+ GaN for Ohmic contacts, contact metallization, SiN passivation.

As noted above, other materials that may be used in heterostructures that can produce 2DEG and/or a 2DEG at their interface include binary ternary, or quaternary Sc, B, In, Al, or Ga-nitride alloys incorporating N-polar, In-polar, Al-polar, or Ga-polar materials having In, Al, or Ga in the crystal lattice, e.g., $(In_xAl_{1-x}N)$, $In_xGa_{1-x}N$, $Al_xGa_{1-x}N$, $In_xAl_yGa_{1-x-y}N$, where ($0<x\leq1$, $0<y\leq1$, $0<x+y\leq1$). Other suitable materials may include ZnO, BeO, InN, $LiNbO_3$, $LaAlO_3$, and $SrTiO_3$. Still other materials that can be used include epsilon-phase (Al, In)$Ga_2O_3$, 2H—SiC, and $LaAlO_3$, where structures such as $LaAlO_3/SrTiO_3$ heterojunctions formed from such materials can lead to the formation of a 2DEG and/or a 2DHG at their interface, and oxides such as $BaTiO_3$ and $PbTiO_3$. In still other embodiments, one of the materials used in the heterostructure may be non-polar, i.e., have a polarity at or near zero.

In other embodiments, multiple heterostructures can be formed on a single carrier substrate, where all of the multiple heterostructures exhibit the production of a 2DEG or a 2DHG, or where one or more of the heterostructures exhibits production of a 2DEG while one or more other heterostructures exhibits production of a 2DHG. In any of these embodiments, the materials used in the various heterostructures may be the same or they may be different, as the various applications to which they are intended may dictate. For example, in some embodiments, one heterostructure may exhibit production of a 2DEG, while another heterostructure situated adjacent thereto exhibits production of a 2DHG; such a configuration of adjoining structures may be particularly useful in devices such as complementary metal-oxide semiconductor (CMOS) devices or other similar multifunctional applications.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A semiconductor device including engineered polarities comprising:
   a first polar semiconductor crystal; and
   a second polar semiconductor crystal having a bonding surface bonded to a bonding surface of the first polar semiconductor crystal via a direct bonding process, thereby providing an interface;
   wherein the interface generates a spontaneous polarization-induced charge, resulting in a two-dimensional electron gas (2DEG) or a two-dimensional hole gas (2DHG) at the interface; and
   wherein the bonding surface of the first polar semiconductor crystal and the bonding surface of the second polar semiconductor crystal are chemically activated bonding surfaces, resulting in room temperature covalent bonding between the first polar semiconductor crystal and the second polar semiconductor crystal.

2. The semiconductor device of claim 1, wherein the interface comprises a strain-relaxed bonded interface, such that the two-dimensional electron gas (2DEG) or the two-dimensional hole gas (2DHG) at the interface generates in the absence of piezoelectric polarization.

3. The semiconductor device of claim 1, wherein the first polar semiconductor crystal has a smaller thickness than the second polar semiconductor crystal.

4. The semiconductor device of claim 1, wherein a difference between a spontaneous polarization constant of the first polar semiconductor crystal and a spontaneous polarization constant of the second polar semiconductor crystal is a net positive difference, resulting in the 2DEG at the interface.

5. The semiconductor device of claim 1, wherein a bonding surface of the first polar semiconductor crystal has a polar orientation opposite to the bonding surface of the second polar semiconductor crystal.

6. The semiconductor device of claim 5, wherein the first polar semiconductor crystal comprises Ga-polar oriented GaN, the second polar semiconductor crystal comprises N-polar oriented AlN, and an N-face of the Ga-polar oriented GaN is directly bonded to an N-face of the N-polar oriented AlN.

7. The semiconductor device of claim 1, wherein the first polar semiconductor crystal comprises N-polar oriented GaN, the second polar semiconductor crystal comprises N-polar oriented AlN, and an Ga-face of the N-polar oriented GaN is directly bonded to an N-face of the N-polar oriented AlN.

8. The semiconductor device of claim 1, wherein a difference between a spontaneous polarization constant of the first polar semiconductor crystal and a spontaneous polarization constant of the second polar semiconductor crystal is a net negative difference, resulting in the 2DHG at the interface.

9. The semiconductor device of claim 1, wherein the bonding surface of the first polar semiconductor crystal has a same polar orientation as the bonding surface of the second polar semiconductor crystal.

10. The semiconductor device of claim 9, wherein the first polar semiconductor crystal comprises Ga-polar oriented GaN, the second polar semiconductor crystal comprises Al-polar oriented AlN, and an N-face of the Ga-polar oriented GaN is directly bonded to an Al-face of the Al-polar oriented AlN.

11. The semiconductor device of claim 1, wherein the first polar semiconductor crystal comprises N-polar oriented GaN, the second polar semiconductor crystal comprises Al-polar oriented AlN, and a Ga-face of the N-polar oriented GaN is directly bonded to an Al-face of the Al-polar oriented AlN.

12. The semiconductor device of claim 1, wherein the first polar semiconductor crystal and the second polar semiconductor crystal each have a thickness of 3-16 µm.

13. The semiconductor device of claim 1, wherein the second polar semiconductor crystal is directly bonded to the bonding surface of the first polar semiconductor crystal without any interfacial bonding layer between the first and second polar semiconductor crystals.

14. The semiconductor device according to claim 1, wherein at least one of the first and second polar semiconductor crystals is a III-nitride material.

15. The semiconductor device according to claim 1, wherein at least one of the first and second polar semiconductor crystals is InN, AlN, or GaN.

16. The semiconductor device according to claim 1, wherein at least one of the first and second polar semiconductor crystals is a binary, ternary, or quaternary alloy incorporating N-polar, In-polar, Al-polar, or Ga-polar materials having In, Al, or Ga in its crystal lattice.

17. The semiconductor device according to claim 1, wherein at least one of the first and second polar semiconductor crystals is selected from the group consisting of: (Sc, B, Al, In, Ga)N, epsilon-phase (Al, In)Ga2O3, 2H—SiC, ZnO, BeO, InN, LiNbO3, LaAlO3, and SrTiO3.

18. The semiconductor device according to claim 1, wherein at least one of the first and second polar semiconductor crystals is an epitaxial material layer.

19. The semiconductor device according to claim 1, wherein the device is a GaN/AlN HEMT comprising a thin GaN layer disposed on an upper surface of an AlN layer.

20. The semiconductor device according to claim 1, wherein the device is an AlN/GaN HEMT comprising a thin AlN layer disposed on an upper surface of a GaN layer.

21. The semiconductor device according to claim 1, having an electron concentration of $10^{20}$ cm$^{-3}$ at the interface.

22. The semiconductor device according to claim 1, having a hole concentration of $10^{20}$ cm$^{-3}$ at the interface.

23. The semiconductor device according to claim 1, wherein the first polar semiconductor crystal has a thickness between 0.5 μm and 15 μm.

\* \* \* \* \*